(12) United States Patent
Lee et al.

(10) Patent No.: US 12,381,172 B2
(45) Date of Patent: Aug. 5, 2025

(54) SEMICONDUCTOR PACKAGE AND FABRICATING METHOD THEREOF

(71) Applicant: SAMSUNG ELECTRONICS CO., LTD., Suwon-si (KR)

(72) Inventors: Dae Hee Lee, Cheonan-si (KR); Tae-Ho Ko, Cheonan-si (KR); Jun Woo Myung, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 505 days.

(21) Appl. No.: 17/717,291

(22) Filed: Apr. 11, 2022

(65) Prior Publication Data

US 2023/0012399 A1 Jan. 12, 2023

(30) Foreign Application Priority Data

Jul. 6, 2021 (KR) .................... 10-2021-0088503

(51) Int. Cl.
| | |
|---|---|
| H01L 23/00 | (2006.01) |
| H01L 21/56 | (2006.01) |
| H01L 23/31 | (2006.01) |
| H01L 25/10 | (2006.01) |

(52) U.S. Cl.
CPC ............. *H01L 24/20* (2013.01); *H01L 21/56* (2013.01); *H01L 23/3114* (2013.01); *H01L 23/3135* (2013.01); *H01L 24/19* (2013.01); H01L 24/14 (2013.01); H01L 24/16 (2013.01); H01L 24/73 (2013.01); H01L 25/105 (2013.01); H01L 2224/14181 (2013.01); H01L 2224/16145 (2013.01); H01L 2224/2101 (2013.01); H01L 2224/221 (2013.01); H01L 2224/73101 (2013.01); H01L 2225/1058 (2013.01)

(58) Field of Classification Search
CPC ......... H01L 24/20; H01L 24/19; H01L 24/14; H01L 24/16; H01L 24/73; H01L 21/56; H01L 23/3114; H01L 25/105
See application file for complete search history.

(56) References Cited

U.S. PATENT DOCUMENTS

| | | |
|---|---|---|
| 9,320,148 B2 | 4/2016 | Mikado et al. |
| 9,589,222 B2 | 3/2017 | Nakamura et al. |
| 10,026,681 B2 | 7/2018 | Ko et al. |

(Continued)

FOREIGN PATENT DOCUMENTS

| | | |
|---|---|---|
| KR | 10-2017-0112906 A | 10/2017 |
| KR | 10-2020-0046627 A | 5/2020 |
| KR | 10-2020-0111003 A | 9/2020 |

OTHER PUBLICATIONS

Office Action dated Apr. 20, 2025 issued in Korean Patent Application No. 10-2021-0088503.

*Primary Examiner* — Nathan W Ha
(74) *Attorney, Agent, or Firm* — MORGAN, LEWIS & BOCKIUS LLP

(57) ABSTRACT

A semiconductor package includes: a first redistribution layer; a first semiconductor chip including a first side and a second side, wherein the first side faces the first redistribution layer; a first sealing material covering the second side of the first semiconductor chip and having a first filler content; a second sealing material formed on the first sealing material and having a second filler content lower than the first filler content; and a second redistribution layer disposed on the second sealing material.

18 Claims, 21 Drawing Sheets

(56) References Cited

U.S. PATENT DOCUMENTS

| | | |
|---|---|---|
| 10,062,652 B2 | 8/2018 | Lee et al. |
| 10,643,919 B2 | 5/2020 | Oh et al. |
| 10,665,549 B2 | 5/2020 | Bae et al. |
| 2012/0168942 A1* | 7/2012 | Gan ................... H01L 21/486 257/738 |
| 2012/0168944 A1* | 7/2012 | Gan ................... H01L 21/561 438/653 |
| 2017/0278766 A1* | 9/2017 | Kim ................ H01L 23/5386 |
| 2018/0082933 A1* | 3/2018 | Ko ..................... H01L 21/568 |
| 2019/0252311 A1* | 8/2019 | Kuroyanagi ........ H01L 23/5226 |
| 2019/0273030 A1* | 9/2019 | Lim .................. H01L 23/3675 |
| 2020/0051918 A1* | 2/2020 | Bae ..................... H01L 24/17 |
| 2020/0066613 A1* | 2/2020 | Lee ................... H01L 23/3128 |
| 2020/0083163 A1* | 3/2020 | Kuroyanagi ............ H01L 24/09 |
| 2020/0111742 A1 | 4/2020 | Han et al. |
| 2020/0135633 A1* | 4/2020 | Moon ................. H01L 23/481 |
| 2020/0303314 A1 | 9/2020 | Kang et al. |
| 2020/0312801 A1 | 10/2020 | Ko et al. |
| 2020/0335460 A1* | 10/2020 | Lee ................... H01L 23/3114 |
| 2021/0358838 A1 | 11/2021 | Moon et al. |
| 2022/0285289 A1* | 9/2022 | Hsieh .................... H01L 24/96 |

\* cited by examiner

SEMICONDUCTOR PACKAGE AND FABRICATING METHOD THEREOF

CROSS-REFERENCE TO RELATED APPLICATION

This application claims priority under 35 U.S.C. § 119 to Korean Patent Application No. 10-2021-0088503, filed on Jul. 6, 2021, in the Korean Intellectual Property Office, the disclosure of which is incorporated by reference herein in its entirety.

TECHNICAL FIELD

The present inventive concept relates to a semiconductor package, and more particularly, to a semiconductor package and fabricating method of the semiconductor package.

DISCUSSION OF THE RELATED ART

With the desire for electronic devices having high-performance, a semiconductor chip size has increased and a semiconductor package size has increased accordingly. In addition, a thickness of the semiconductor package has decreased due to the decreased thickness of an electronic device.

In addition, the semiconductor package is under development to provide multi-functionality, high capacity and miniaturization. To this end, by integrating a plurality of semiconductor chips inside a single semiconductor package, it has become possible to perform high capacity and multiple functions, while reducing the size of the semiconductor package.

In recent years, one of the major trends for technological development related to the semiconductor chips is to reduce the size of components. Thus, even in the field of semiconductor packages, it is desirable to implement a large number of pins, while having a small size in accordance with a rapid increase in demand for small semiconductor chips, and the like.

One of the packaging technologies under development to satisfy this desire is a fan-out semiconductor package. Generally, the fan-out semiconductor package may implement a large number of pins, while having a small size.

SUMMARY

According to an exemplary embodiment of the present inventive concept, a semiconductor package includes: a first redistribution layer; a first semiconductor chip including a first side and a second side, wherein the first side faces the first redistribution layer; a first sealing material covering the second side of the first semiconductor chip and having a first filler content; a second sealing material formed on the first sealing material and having a second filler content lower than the first filler content; and a second redistribution layer disposed on the second sealing material.

According to an exemplary embodiment of the present inventive concept, a semiconductor package includes: a first redistribution layer; a first semiconductor chip having a first side and a second side, wherein the first side is on the first redistribution layer, and the second side faces the first side; a first sealing material contacting the second side of the first semiconductor chip and having a first filler content; a second sealing material formed on the first sealing material and having a second filler content lower than the first filler content; and a second redistribution layer placed on the second sealing material, wherein the second redistribution layer includes a first via hole and a first via, wherein the first via hole penetrates the first and second sealing materials, and the first via fills the first via hole, wherein the first via hole includes a first region and a second region, wherein the first region is formed on the first sealing material, and the second region is formed on the second sealing material, and wherein a first surface roughness of the second region is smaller than a second surface roughness of the first region.

According to an exemplary embodiment of the present inventive concept, a method for fabricating a semiconductor package includes: forming a first semiconductor chip including a first side and a second side, wherein the first side faces a sacrificial member, forming a first sealing material having a first filler content and covering the second side of the first semiconductor chip; forming a second sealing material on the first sealing material and having a second filler content lower than the first filler content; and forming a second redistribution layer on the second sealing material.

BRIEF DESCRIPTION OF THE DRAWINGS

The above and other features of the present inventive concept will become more apparent by describing in detail exemplary embodiments thereof, with reference to the attached drawings, in which.

DETAILED DESCRIPTION OF THE EMBODIMENTS

Hereinafter, exemplary embodiments of the present inventive concept will be described with reference to the accompanying drawings.

Hereinafter, an electronic device 1 including a semiconductor package 100 including first and second sealing materials 155 and 530 will be described with reference to FIGS. 1 to 6.

Figure 1:
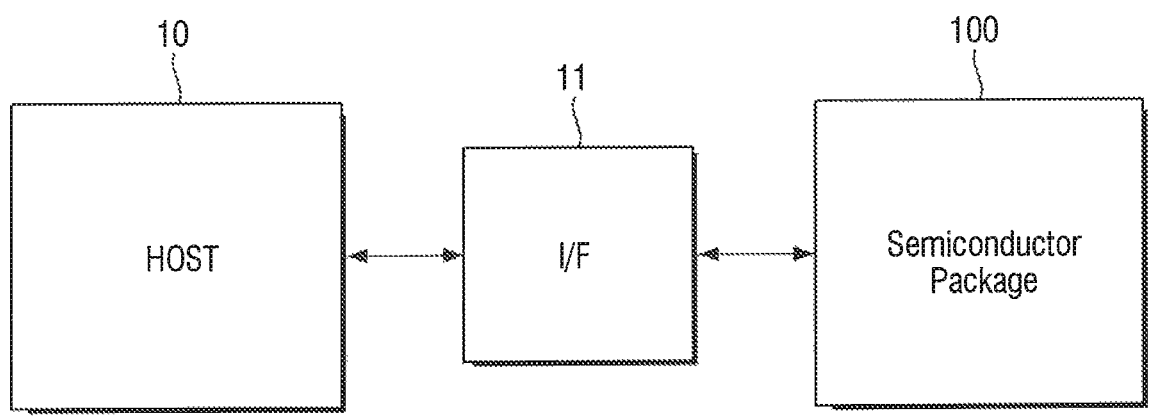
FIGS. 1 and 2 are diagrams illustrating an electronic device according to an exemplary embodiment of the present inventive concept.
Figure 2:
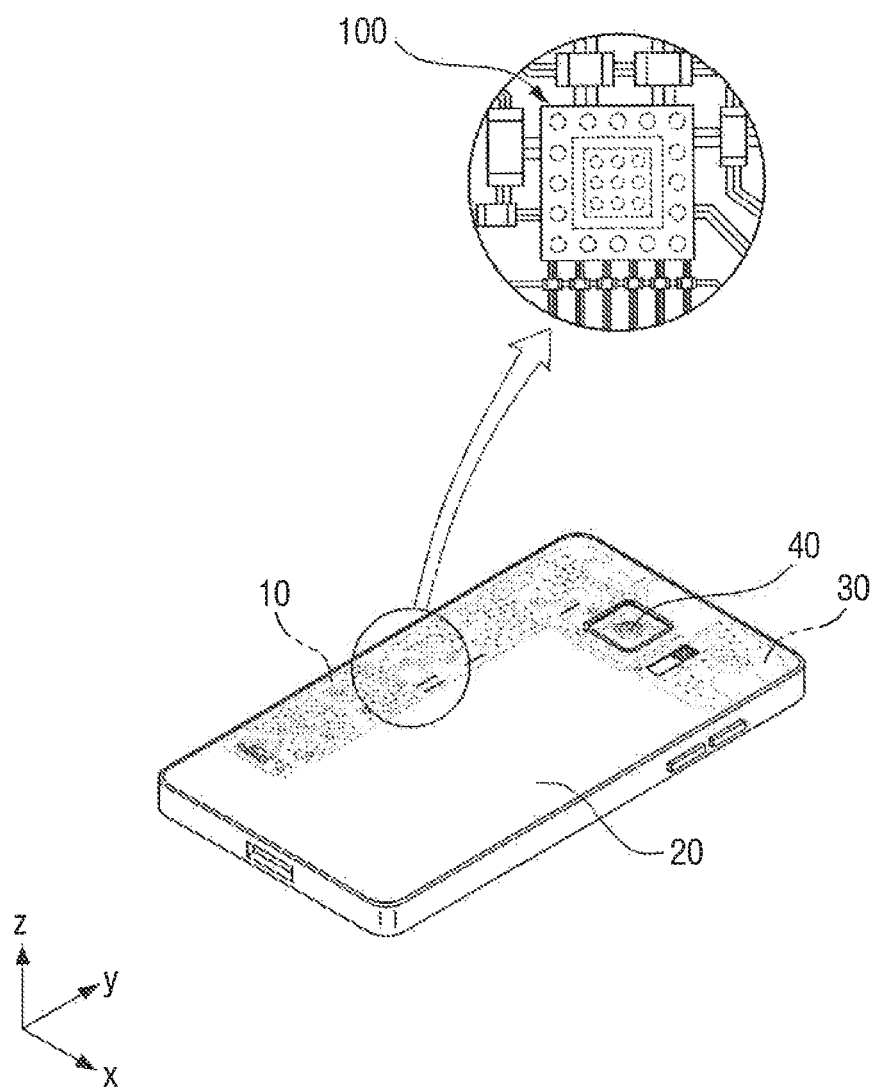
Figure 3:
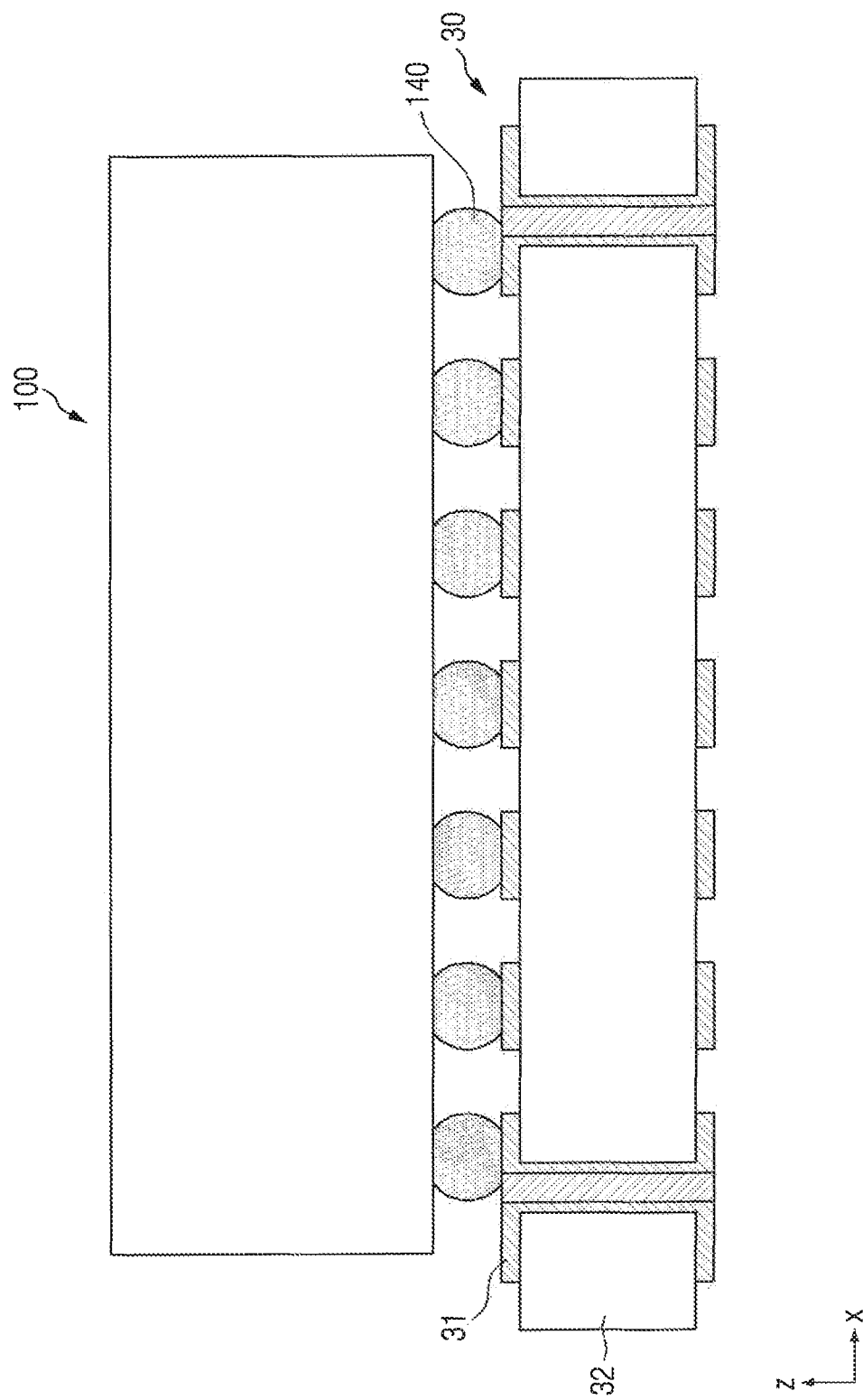
FIG. 3 is a diagram illustrating a semiconductor package and a motherboard of FIG. 2.
Figure 4:
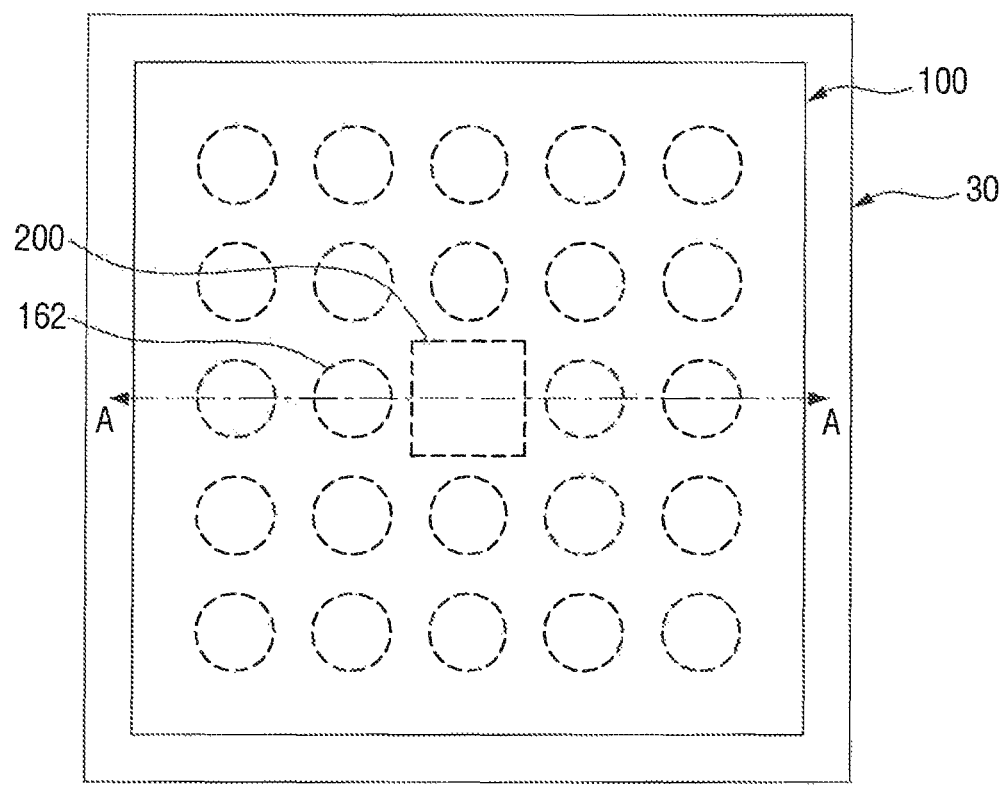
FIG. 4 is a top view of the semiconductor package of FIG. 3.
Figure 5:
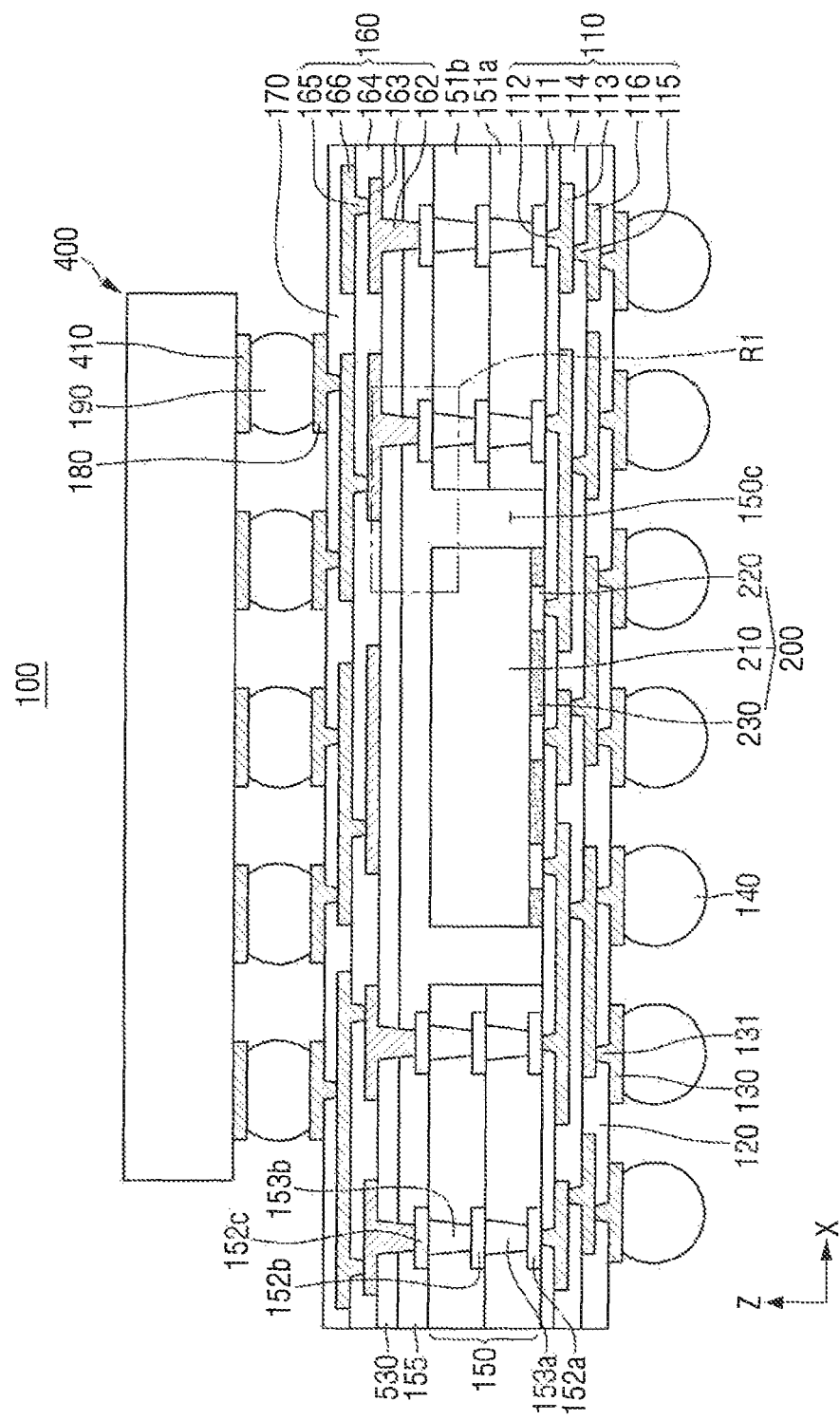
FIG. 5 is a cross-sectional view illustrating a semiconductor package taken along A-A of FIG. 4.
Figure 6:
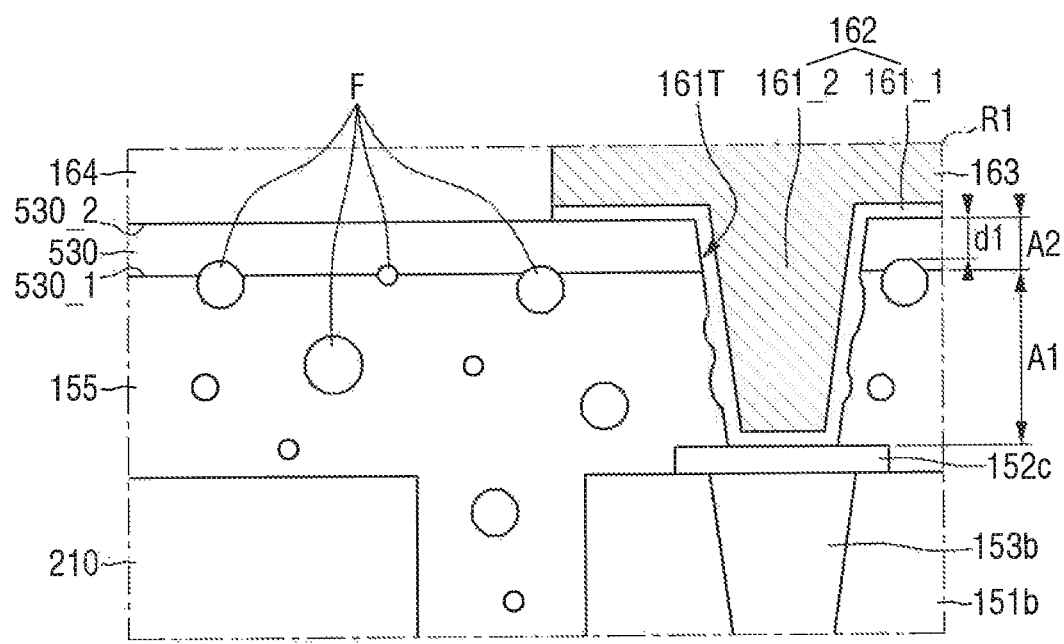
FIG. 6 is an enlarged view of a region R1 of FIG. 5.

FIGS. 1 and 2 are diagrams illustrating an electronic device according to an exemplary embodiment of the present inventive concept. FIG. 3 is a diagram illustrating the semiconductor package and a motherboard of FIG. 2. FIG. 4 is a top view of the semiconductor package of FIG. 3. FIG. 5 is a cross-sectional view illustrating a semiconductor package taken along A-A of FIG. 4. FIG. 6 is an enlarged view of a region R1 of FIG. 5.

Referring to FIG. 1, an electronic device 1 may include a host 10, an interface 11 and a semiconductor package 100.

In an exemplary embodiment of the present inventive concept, the host 10 may be connected to the semiconductor package 100 through the interface 11. For example, the host 10 may transmit a signal to the semiconductor package 100 to control the semiconductor package 100. Further, for example, the host 10 may receive the signal from the semiconductor package 100 to process the data included in the signal.

For example, the host 10 may include a central processing unit (CPU), a controller or an application specific integrated circuit (ASIC) or the like. Further, for example, the host 10 may include a memory chip such as a DRAM (Dynamic Random Access Memory), a SRAM (Static RAM), a PRAM (Phase-change RAM), a MRAM (Magneto resistive RAM), a FeRAM (Ferroelectric RAM), and a RRAM (Resistive RAM).

Referring to FIGS. 1 and 2, the electronic device 1 may include a host 10, a body 20, a motherboard 30, a camera module 40, and a semiconductor package 100.

The motherboard 30 may be mounted inside the body 20 of the electronic device 1. The host 10, the camera module 40 and the semiconductor package 100 may be mounted on the motherboard 30. The host 10, the camera module 40 and the semiconductor package 100 may be electrically connected to one another by the motherboard 30. For example, the interface 11 may be implemented by the motherboard 30.

The host 10 and the semiconductor package 100 may be electrically connected to each other by the motherboard 30 to send and receive signals.

Referring to FIG. 3, the semiconductor package 100 may be placed on the motherboard 30. For example, a connection terminal 140 of the semiconductor package 100 may be placed on the motherboard 30. For example, the motherboard 30 may be connected to the semiconductor package 100 by the connection terminal 140 of the semiconductor package 100.

The motherboard 30 may be, for example, a printed circuit board (PCB), a ceramic substrate, a glass substrate, an interposer substrate, or the like. However, the present inventive concept is not limited thereto, and throughout the specification, as an example, the motherboard 30 will be described on the premise that it is a printed circuit board.

The motherboard 30 may include a wiring structure 31 and a core 32. The core 32 may include, for example, a CCL (Copper Clad Laminate), a photoplethysmogram (PPG), an ABF (Ajimoto Build-up Film), epoxy, polyimide and the like. The wiring structure 31 may include, for example, but is not limited to, at least one of copper (Cu), aluminum (Al), silver (Ag), tin (Sn), gold (Au), nickel (Ni), lead (Pb), titanium (Ti), and alloys thereof.

The core 32 may be placed at a central part of the motherboard 30, and the wiring structure 31 may be located above and below the core 32. The wiring structure 31 may be placed to be exposed above and below the motherboard 30. For example, the wiring structure 31 may extend along the side surfaces of the core 32.

Further, the wiring structure 31 may be placed to penetrate the core 32. The wiring structure 31 may electrically connect the elements that come into contact with the motherboard 30 to each other. For example, the wiring structure 31 may electrically connect the semiconductor package 100 and the host 10 to each other. For example, the wiring structure 31 may electrically connect the semiconductor package 100 and the host 10 to each other through the connection terminal 140.

Referring to FIGS. 4 and 5, the semiconductor package 100 may include a first redistribution layer 110, a first semiconductor chip 200, a first sealing material 155, a second sealing material 530, a second redistribution layer 160, and a connecting structure 150.

The first semiconductor chip 200 may be placed on the first redistribution layer 110. For example, the first semiconductor chip 200 may be placed on the central part of the first redistribution layer 110. The first semiconductor chip 200 may be electrically connected to the first redistribution layer 110.

The first semiconductor chip 200 may include, for example, a logic circuit. For example, the first semiconductor chip 200 may include an integrated circuit (IC). For example, the first semiconductor chip 200 may include, but is not limited to, an application processor chip such as a central processor (e.g., CPU), a graphic processor (e.g., GPU), a digital signal processor, an encryption processor, a microprocessor and a microcontroller.

The first semiconductor chip 200 may include a body 210, a connection pad 220 and a passivation film 230. The body 210 may include, for example, silicon (Si), germanium (Ge), gallium arsenide (GaAs), and the like, and the body 210 may include various circuits. The connection pad 220 may connect the semiconductor chip 200 to another configuration (e.g., the first redistribution layer 110). The connection pad 220 may include a conductive substance. The passivation film 230 may expose the connection pad 220 disposed on the body 210. The passivation film 230 may be, for example, an oxide film, a nitride film or a double layer of the oxide film and the nitride film.

The connecting structure 150 has a cavity 150c in the form of a through hole. The first semiconductor chip 200 may be placed in the cavity 150c so that a side on which the connection pad 220 is placed faces an upper side of the first redistribution layer 110. The connecting structure 150 may include a wiring structure having first to third wiring layers 152a, 152b and 152c and first and second connecting vias 153a and 153b. The connecting structure 150 includes a first interlayer insulating layer 151a, a second interlayer insulating layer 151b, a first connecting pad 152a, a second connecting pad 152b, a third connecting pad 152c, a first connecting via 153a, and a second connecting via 153b. The first interlayer insulating layer 151a is disposed on the first redistribution layer 110. For example, the first interlayer insulating layer 151a may contact the upper surface of the first redistribution layer 110. The first connecting pad 152a is disposed on the first redistribution layer 110 and is covered by the first interlayer insulating layer 151a. For example, the first connecting pad 152a may contact the upper surface of the first redistribution layer 110. The second connecting pad 152b is disposed on the first interlayer insulating layer 151a. For example, the first connecting pad 152a is covered by a first surface (e.g., a lower surface) of the first interlayer insulating layer 151a, and the second connecting pad 152b is disposed on a second surface (e.g., an upper surface), opposite to the first surface, of the first interlayer insulating layer 151a. The second interlayer insulating layer 151b is disposed on the second surface of the first interlayer insulating layer 151a and covers at least a part of the second connecting pad 152b. The third connecting pad 152c is disposed on the second interlayer insulating layer 151b. For example, the second connecting pad 152b is covered by a first surface (e.g., a lower surface) of the second interlayer insulating layer 151b, and the third connecting pad 152c is disposed on a second surface (e.g., an upper surface), opposite to the first surface, of the second interlayer insulating layer 151b. The first connecting via 153a penetrates the first interlayer insulating layer 151a, and electrically connects the first and second connecting pads 152a and 152b to each other. The second connecting via 153b penetrates the second interlayer insulating layer 151b, and electrically connects the second and third connecting pads 152b and 152c to each other.

An insulating substance may be used as the material for the first and second interlayer insulating layers 151a and 151b. For example, a thermosetting resin such as an epoxy resin, a thermoplastic resin such as polyimide, or insulating substances obtained by impregnating the resins in a core material such as an inorganic filler and/or a glass fiber (Glass Cloth or Glass Fabric), for example, prepreg, ABF (Ajinomoto Build-up Film), FR-4, BT (Bismaleimide Triazine) and the like may be used as the insulating substance.

The first to third connecting pads 152a, 152b and 152c may perform the role of providing a pad pattern for the connecting vias 153a and 153b for connecting the top/bottom of the semiconductor package 100. The substance for forming the first to third connecting pads 152a, 152b and 152c may use metallic substances such as copper (Cu), aluminum (Al), silver (Ag), tin (Sn), gold (Au), nickel (Ni), lead (Pb), titanium (Ti) or alloys thereof. The first to third connecting pads 152a, 152b and 152c may perform various functions depending on the design of the layer.

For example, the first to third connecting pads 152a, 152b and 152c may include a ground pattern, a power pattern, a signal pattern, and the like. Here, the signal pattern includes various signals except for a ground pattern and a power pattern related to the power supply, for example, a data signal and the like. However, the present inventive concept is not limited thereto.

The first and second connecting vias 153a and 153b electrically connect the first to third connecting pads 152a, 152b and 152c formed in different layers to each other, and consequentially forms an electrical path inside the connecting structure 150. In addition, the first and second connecting vias 153a and 153b form an electrical path between the first redistribution layer 110 and the connection terminal 140. A metallic substance may be used as the material for the first and second connecting vias 153a and 153b. For example, each of the first and second connecting vias 153a and 153b may be field vias that are completely filled with a metallic substance, or may be a conformal via in which the metallic substance is formed along the wall side of the via hole. Further, for example, the first and second connecting vias 153a and 153b may each have a tapered shape. In addition, the first and second connecting vias 153a and 153b may be integrated with at least a part of the first to third connecting pads 152a, 152b and 152c, but the preset inventive concept is not limited thereto.

The first sealing material 155 may cover the first redistribution layer 110. The first sealing material 155 may cover the connecting structure 150 placed on the first redistribution layer 110. The first sealing material 155 may cover at least a part of the first semiconductor chip 200 placed on the first redistribution layer 110. For example, the first sealing material 155 may cover the side wall of the first semiconductor chip 200. Further, for example, the first sealing material 155 may cover the upper side of the first semiconductor chip 200.

The first sealing material 155 may protect the first semiconductor chip 200 and the connecting structure 150. The first sealing material 155 may fill the cavity 150c between the connecting structure 150 and the first semiconductor chip 200. For example, a gap between a sidewall of the first semiconductor chip 200 and an inner sidewall of the connecting structure 150 may be filled with the first sealing material 155.

The first sealing material 155 may include an insulating substance. For example, the first sealing material 155 may include a thermosetting resin such as an epoxy resin, a thermoplastic resin such as polyimide, or a resin in which a reinforcing material such as a filler (F) is included therein, for example, ABF, FR-4, BT, PID resin, and the like. The first sealing material 155 may include the filler (F) to have a first filler content. Further, for example, the first sealing material 155 may also include a known molding substance such as epoxy molding compound (EMC).

The filler (F) may use at least one or more of silica ($SiO_2$), alumina ($Al_2O_3$), silicon carbide (SiC), barium sulfate ($BaSO_4$), talc, mud, mica powder, aluminum hydroxide ($AlOH_3$), magnesium hydroxide ($Mg(OH)_2$)), calcium carbonate ($CaCO_3$), magnesium carbonate ($MgCO_3$), magnesium oxide (MgO), boron nitride (BN), aluminum borate ($AlBO_3$), barium titanate ($BaTiO_3$) and/or calcium zirconate ($CaZrO_3$). In addition, the material of the filler (F) is not limited thereto, and the filler (F) may also include a metallic substance and/or an organic substance.

The first sealing material 155 may include a first side and a second side. The first side of the first sealing material 155 may be a side facing the first redistribution layer 110, and the second side of the first sealing material 155 may be a side facing the second sealing material 530. For example, the first side of the first sealing material 155 may be in contact with the first redistribution layer 110, and the second side of the first sealing material 155 may be in contact with the second sealing material 530. The first redistribution layer 110 may be placed on the first side of the first sealing material 155, and the second sealing material 530 may be placed on the second side of the first sealing material 155.

The second sealing material 530 may include a first side 530_1 and a second side 530_2. The first side 530_1 of the second sealing material 530 may be a side facing the first sealing material 155, and the second side 530_2 of the second sealing material 530 may be a side facing the second redistribution layer 160. The first side 5301 may be in contact with the first sealing material 155, and the second side 530_2 may be in contact with the second redistribution layer 160. The first side 530_1 of the second sealing material 530 is formed on the first sealing material 155, and the second side 530_2 of the second sealing material 530 may be placed on the second redistribution layer 160.

The second sealing material 530 may include an insulating substance. For example, the second sealing material 530 may include a thermosetting resin such as an epoxy resin and a thermoplastic resin such as polyimide. Further, for example, the second sealing material 530 may also include a known molding substance such as EMC.

The second sealing material 530 may have a second filler content lower than the first filler content of the first sealing material 155. For example, the second sealing material 530 may not include the filler (F).

The filler (F) contents of the first and second sealing materials 153 and 530 may be compared on the basis of a ratio of atomic weights (wt %) per unit area of the first and second sealing materials 153 and 530. Further, the filler (F) contents of the first and second sealing materials 153 and 530 may be compared on the basis of a ratio (at %) of the number of atoms per unit area of the first and second sealing materials 153 and 530. However, the present inventive concept is not limited thereto.

Referring to FIG. 6, the filler (F) is located at a boundary between the first sealing material 155 and the second sealing material 530, and the filler (F) might not be located inside the second sealing material 530 except for the boundary between the first sealing material 155 and the second sealing material 530.

Further, in the second sealing material 530, the filler (F) content at a first position separated by a first distance from the second redistribution layer 160 may be lower than the filler (F) content at a second position separated by a second distance d1 farther than the first distance from the second redistribution layer 160. In the current embodiment, the second distance d1 may be a distance from the second side 530_2 of the second sealing material 530 to the upper side of any filler (F) on the basis of a direction in which the first redistribution layer 110, the first semiconductor chip 200, and the second redistribution layer 160 are stacked, for example, a Z direction. The first distance may be a distance smaller than the second distance d1, for example, a distance that is about half of the second distance d1. However, the present inventive concept is not limited thereto.

A thickness of the second sealing material 530 may be thinner than a thickness of the first sealing material 155. Since the filler content of the second sealing material 530 is lower than the filler content of the first sealing material 155, the thickness of the second sealing material 530 may be thinner than the thickness of the first sealing material 155. For example, the thickness of the second sealing material 530 may be about 5 μm or less. However, the thickness of the second sealing material 530 is not limited thereto.

Consequentially, an overall thickness of the semiconductor package may be reduced as compared to a conventional case where the second sealing material 530 including the filler (F) is used.

The first redistribution layer 110 may redistribute the connection pad 220 of the first semiconductor chip 200. The first redistribution layer 110 may be, for example, a FRDL (front redistribution layer). A plurality of connection pads 220 of the first semiconductor chip 200 may be redistributed through the first redistribution layer 110. For example, the plurality of connection pads 220 may be physically or electrically connected to the first connection terminal 140 through the first redistribution layer 110.

The first redistribution layer 110 may come into contact with the first semiconductor chip 200 and a part of the first sealing material 155. For example, the upper side of the first redistribution layer 110 facing the first semiconductor chip 200 and the first sealing material 155 may come into contact with the first semiconductor chip 200 and a part of the first sealing material 155.

The first redistribution layer 110 may include an insulating layer 111, a via 112, a line wiring 113, an insulating layer 114, a via 115, a line wiring 116, and the like.

The insulating layer 111 may be formed on the first sealing material 155. The via 112 may penetrate the insulating layer 111 and be connected to the line wiring 113. The line wiring 113 is connected to the via 112 and may be formed below the insulating layer 111. The via 112 may connect the first connecting pad 152a to the line wiring 113. The via 112 may connect the connection pad 220 of the first semiconductor chip 200 to the line wiring 113.

The insulating layer 114 may be formed on the insulating layer 111 and may cover the insulating layer 111 and the line wiring 113. The via 115 may penetrate the insulating layer 114 and be connected to the line wiring 116. The line wiring 116 is connected to the via 115 and may be formed below the insulating layer 114. The via 115 may connect the line wiring 113 and the line wiring 116 to each other.

The insulating layers 111 and 114 may include an insulating substance. For example, the insulating layers 111 and 114 may include a photosensitive insulating substance such as a PID resin, in addition to a thermosetting resin such as epoxy resin and a thermoplastic resin such as polyimide. When the photosensitive insulating substance is used as the insulating layers 111 and 114, the insulating layers 111 and 114 may be formed to be thinner.

The vias 112 and 115 may electrically connect the line wirings 113 and 116, the connection pad 220 or the like formed in another layer to each other. Accordingly, electrical paths may be formed inside the semiconductor package 100.

The vias 112 and 115 may include conductive substances such as copper (Cu), aluminum (Al), silver (Ag), tin (Sn), gold (Au), nickel (Ni), lead (Pb), titanium (Ti) or alloys thereof. For example, the vias 112 and 115 may be formed by being completely filled with a conductive substance. In addition, for example, in the vias 112 and 115, the conductive substance may be formed along the walls of the via holes. The shapes of the vias 112 and 115 may include all shapes known in the art, such as a tapered shape and a cylindrical shape.

The line wirings 113 and 116 may redistribute the connection pad 220. The line wirings 113 and 116 may include conductive substances such as copper (Cu), aluminum (Al), silver (Ag), tin (Sn), gold (Au), nickel (Ni), lead (Pb), titanium (Ti), or alloys thereof. The line wirings 113 and 116 may perform various functions depending on the design of the layer. For example, the line wirings 113 and 116 may include a ground (GND) pattern, a power (PWR) pattern, a signal (S) pattern, and the like.

The passivation layer 120 may protect the first redistribution layer 110 from the outside. The passivation layer 120 may include an opening 131 that exposes a part of the line wiring 116 of the first redistribution layer 110. The opening 131 may expose a part of one side of the line wiring 116.

The passivation layer 120 may include an insulating substance. For example, the passivation layer 120 may include a photosensitive insulating substance such as a photosensitive insulating resin. Further, the passivation layer 120 may include a solder resist.

An underbump metal layer 130 may increase connection reliability of the connection terminal 140 to increase board level reliability. The underbump metal layer 130 may be formed along the wall side inside the opening 131 of the passivation layer 120 and on an exposed side of the line wiring 116. The underbump metal layer 130 may be formed by a metallization process using a metal.

The connection terminal 140 may physically and electrically connect the semiconductor package 100 to the outside. For example, the semiconductor package 100 may be mounted on the motherboard 30 of the electronic device 1 through the connection terminal 140.

The connection terminal 140 may include a conductive substance. For example, the connection terminal 140 may include a solder or the like. For example, the connection terminal 140 may include a land, a ball, a pin, and the like. The number of connection terminals 140 may vary depending on the number of connection pads 220 of the first semiconductor chip 200.

At least one of the plurality of connection terminals 140 may be placed in a fan-out region. The fan-out region may be a region beyond the region in which the first semiconductor chip 200 is placed. Therefore, the semiconductor package 100 may be a fan-out semiconductor package. The fan-out semiconductor package has increased reliability, may implement a large number of I/O terminals, and has an easier 3D interconnection compared to a fan-in semiconductor package. Further, because the fan-out semiconductor package can be mounted on an electronic device without a separate substrate, compared to a BGA (Ball Grid Array) package, a LGA (Land Grid Array) package, and the like, the fan-out semiconductor package may be fabricated to be thinner and has an advantage of a competitive price.

The second redistribution layer 160 may be placed on the second sealing material 530. For example, the second redistribution layer 160 may be placed on the second side 530_2 of the second sealing material 530. The second redistribution layer 160 may be formed to cover the first semiconductor chip 200 and the second sealing material 530.

The second redistribution layer 160 may redistribute the connection pad 220 of the first semiconductor chip 200. The second redistribution layer 160 may be a BRDL (back redistribution layer). The plurality of connection pads 220 of the first semiconductor chip 200 may be redistributed through the first redistribution layer 110 and the second redistribution layer 160. For example, a plurality of connection pads 220 may be physically or electrically connected to the connection terminal 140 and the connection terminal 190 through the first redistribution layer 110 and the second redistribution layer 160.

The second redistribution layer 160 may come into contact with a part of the first sealing material 155. For example, a first via 162 of the second redistribution layer 160 may come into contact with the connecting structure 150 and the first sealing material 155, and the second sealing material 530. In an exemplary embodiment of the present inventive concept, an additional insulating layer of the second redistribution layer 160 may come into contact with the first sealing material 155.

The second redistribution layer 160 may include a first via 162, a line wiring 163, an insulating layer 164, a via 165, a line wiring 166, and the like.

The first via 162 may penetrate the second sealing material 530 and be connected to the connecting structure 150. A part of the first via 162 may be placed inside the first sealing material 155 and the second sealing material 530. For example, a part of the via 162 which is not surrounded with the first sealing material 155 may come into contact with the second sealing material 530. For example, the via 162 may completely pass through the second sealing material 530 and partially penetrate the first sealing material 155. The line wiring 163 is connected to the first via 162 and may be formed on the second sealing material 530. The first via 162 may connect the connecting structure 150 and the line wiring 163 to each other.

The second redistribution layer may include a first via hole 161T penetrating the first sealing material 155 and the second sealing material 530, and a first via 162 that fills the first via hole 161T.

Referring to FIG. 6, the first via hole 161T includes a first region A1 formed in the first sealing material 155, and a second region A2 formed in the second sealing material 530. A first surface roughness of the second region A2 may be smaller than a second surface roughness of the first region A1. For example, the first surface of the second region A2 may have less protrusions than that of the second surface of the first region A1.

In the present specification, the surface roughness may be the degree of unevenness that occurs on the surface when the metal surface is machined. The surface roughness may be measured by measuring the curve formed by a cutting plane of the surface. In the present specification, the surface roughness may be measured in a manner of measuring a value of a center line average roughness Ra obtained by measuring the surface roughness on the basis of a center average line.

The first via 162 has a seed layer 161_1 and a conductor layer 161_2. The seed layer 161_1 may be conformally formed along the side wall and bottom side of the first via hole 161T, and the conductor layer 161_2 may be formed on the seed layer 161_1 to fill the first via hole 161T.

In this case, the surface roughness of the seed layer 161_1 formed in the second region A2 is smaller than the surface roughness of the seed layer 161_1 formed in the first region A1. Since the filler content of the second sealing material 530 is lower than the filler content of the first sealing material 155, the surface roughness of the seed layer 161_1 being in contact with the second sealing material 530 may be smaller than the surface roughness of the seed layer 161_1 being in contact with the first sealing material 155. For example, the surface roughness Ra of the seed layer 161_1 formed in the second region A2 may be about 0.3 μm or less.

The seed layer 1611 may be a sputtering layer formed by sputtering. For example, the thickness of the seed layer 161_1 formed by sputtering may be about 0.6 μm or less. However, the present inventive concept is not limited thereto.

As a result, because the seed layer 161_1 having a small surface roughness may be formed, the thinner seed layer 161_1 may be formed as compared with the conventional case where the seed layer 161_1 is formed by electroless plating.

The insulating layer 164 may be formed to cover the second sealing material 530 and the line wiring 163. The via 165 may penetrate the insulating layer 164 and be connected to the line wiring 166. The line wiring 166 is connected to the via 165 and may be formed on the insulating layer 164. The via 165 may connect the line wiring 163 and the line wiring 166 to each other.

The first via 162, the line wiring 163, the insulating layer 164, the via 165 and the line wiring 166 of the second redistribution layer 160 may be a configuration corresponding to the via 112, the line wiring 113, the insulating layer 114, the via 115, and the line wiring 116 of the first redistribution layer 110 described above.

However, the present inventive concept is not limited thereto, and the second redistribution layer 160 may include a configuration different from that of the first redistribution layer 110, and may also be formed by another process.

A passivation layer 170 may protect the second redistribution layer 160 from the outside. The passivation layer 170 may expose a part of one side of the line wiring 166.

An underbump metal layer 180 may increase the connection reliability of the connection terminal 190 and increase the board level reliability. The underbump metal layer 180 may be formed along the wall side of the passivation layer 170 and one side of the exposed line wiring 166. For example, the underbump metal layer 180 may be disposed on the passivation layer 170 and penetrate the passivation layer 170 to be connected with the line wiring 166.

The connection terminal 190 may physically and electrically connect the semiconductor package 100 to another semiconductor package.

The passivation layer 170, the underbump metal layer 180 and the connection terminal 190 may be configurations corresponding to the passivation layer 120, the underbump metal layer 130 and the connection terminal 140 described above. However, the present inventive concept is not limited thereto, and the passivation layer 170, the underbump metal layer 180 and the connection terminal 190 may include configurations different from that of the passivation layer 120, the underbump metal layer 130 and the connection terminal 140, and may also be formed by another process.

The first semiconductor chip 200 may be electrically connected to the host 10 through the first redistribution layer 110, the underbump metal layer 130, and the connection terminal 140. The first semiconductor chip 200 may be electrically connected to another semiconductor package (e.g., the semiconductor package 400 of FIG. 5) through the first redistribution layer 110, the connecting structure 150, the second redistribution layer 160, the underbump metal layer 180, and the connection terminal 190. For example, the connection pad 220 of the first semiconductor chip 200 may be redistributed through the first redistribution layer 110, the connecting structure 150, the second redistribution layer 160, and the like.

Referring to FIG. 5, the semiconductor package 100 may further include a semiconductor package 400. For example, the semiconductor package 400 may be placed on the connection terminal 190. For example, the semiconductor package 400 may be placed on the second redistribution layer 160.

The semiconductor package 400 may include a second semiconductor chip and a connection pad 410. The second semiconductor chip may be mounted inside the semiconductor package 400. For example, the second semiconductor chip may include a volatile memory chip such as a DRAM (Dynamic Random Access Memory) or a SRAM (Static RAM), or a non-volatile memory chip such as a PRAM (Phase-change RAM), a MRAM (Magneto resistive RAM), a FeRAM (Ferroelectric RAM) or a RRAM (Resistive RAM).

The second semiconductor chip may be electrically connected to the connection terminal 190 through the connection pad 410. The connection pad 410 may be physically and electrically connected to the connection terminal 190. The semiconductor package 400 may be electrically connected to the first semiconductor chip 200 through the connection terminal 190, the second redistribution layer 160, the connecting structure 150, and the first redistribution layer 110. The first semiconductor chip 200 and the second semiconductor chip may transmit and receive signals through the electrical paths.

The semiconductor package 100 may be a POP (package on package) in which the semiconductor package 400 is mounted on the semiconductor package. Because the connection pad 220 of the first semiconductor chip 200 is redistributed through the first redistribution layer 110, the connecting structure 150 and the second redistribution layer 160, and is connected to the second semiconductor chip, the semiconductor package 100 may mount more semiconductor chips in the same area.

Figure 7:
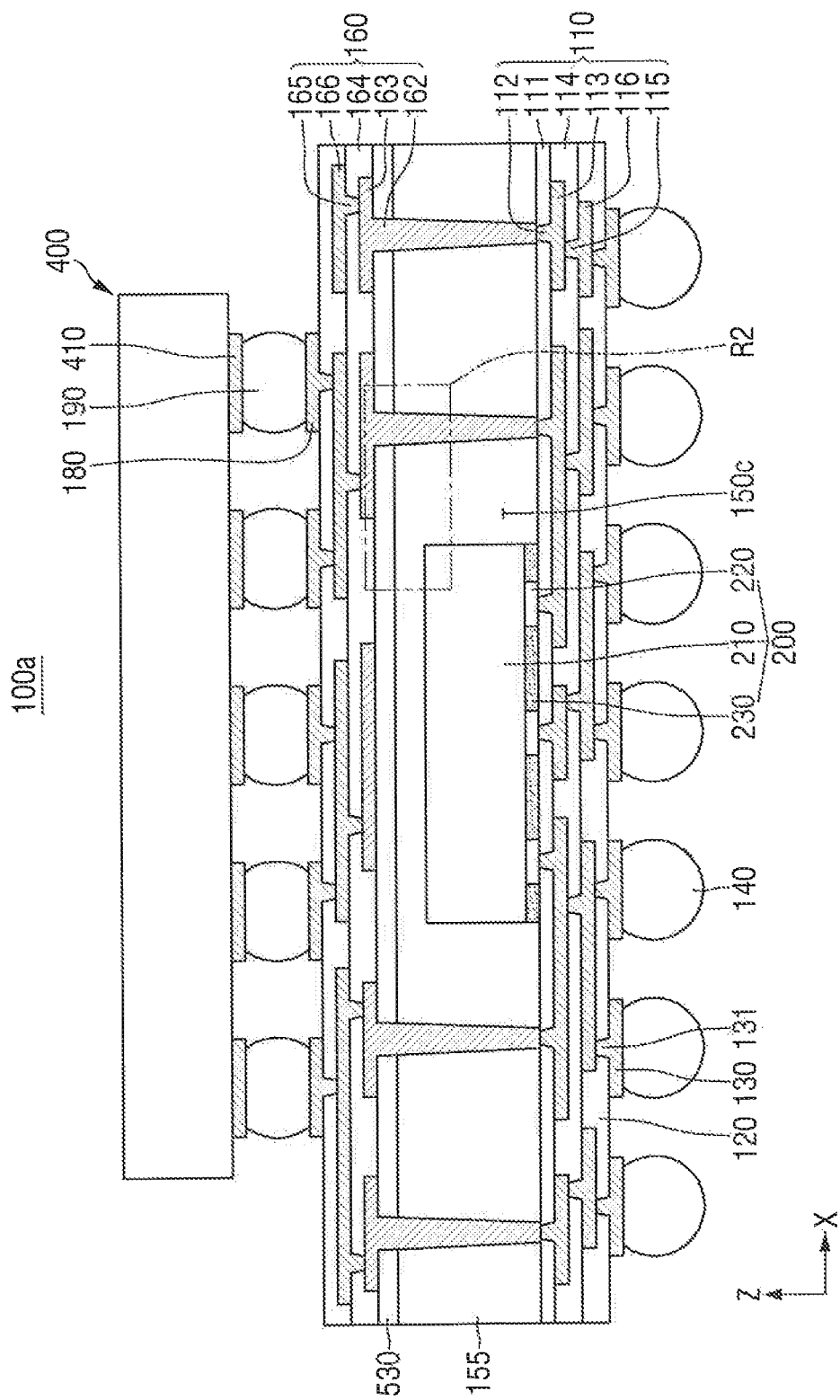
FIG. 7 is a cross-sectional view illustrating a semiconductor package according to an exemplary embodiment of the present inventive concept.
Figure 8:
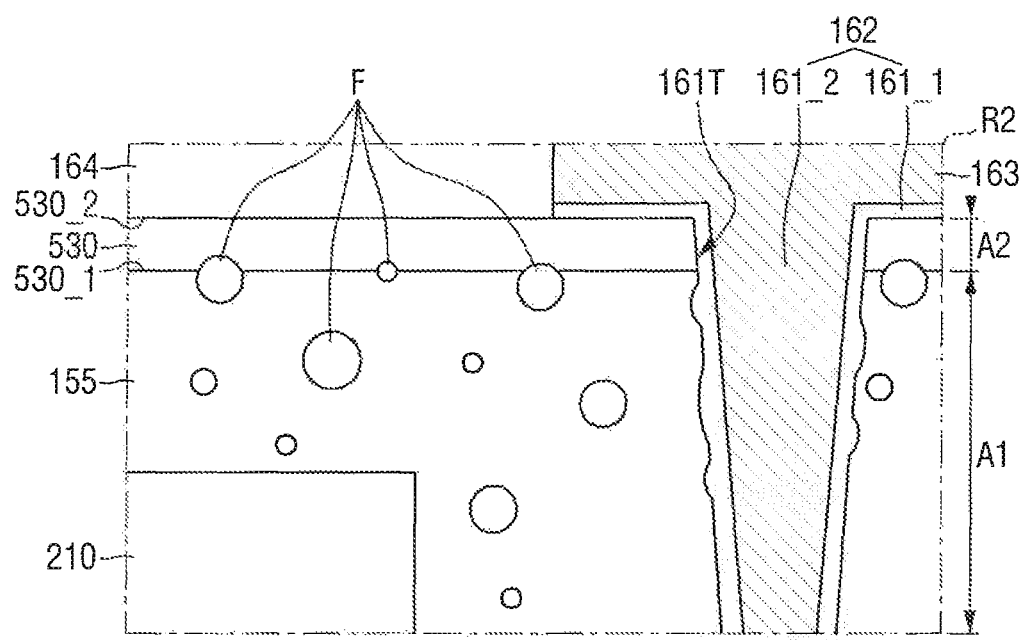
FIG. 8 is an enlarged view of a region R2 of FIG. 7.

FIG. 7 is a cross-sectional view illustrating a semiconductor package according to an exemplary embodiment of the present inventive concept. FIG. 8 is an enlarged view of a region R2 of FIG. 7. To the extent that various elements are not described in detail with respect to FIGS. 7 and 8, it may be assumed that these elements are at least similar to corresponding elements described in detail elsewhere within the instant application. Corresponding elements may have similar or identical reference numerals or may otherwise be recognizable as corresponding based on context.

Referring to FIG. 7, the semiconductor package 100a may include a first via 162 that penetrates the first sealing material 155. For example, the first via 162 may completely penetrate the first sealing material 155. The first via 162 may penetrate the first sealing material 155 to electrically connect the second redistribution layer 160 and the first redistribution layer 110 to each other. For example, the first via 162 may completely penetrate the first sealing material 155. For example, the first via 162 may completely penetrate the first sealing material 155 and come into contact with the line wiring 163 and the via 112.

The first via 162 that completely penetrates the first sealing material 155 may be formed by a method of more deeply machining the first via hole 161T. For example, by forming a thick mask on the second sealing material 530 except the region in which the first via hole 161T is machined, the first via hole 161T may be machined more deeply.

Referring to FIG. 7, the thickness of the first via 162 may be substantially the same as the thickness of the first sealing material 155.

Referring to FIG. 8, the first via hole 161T includes a first region A1 formed on the first sealing material 155, and a second region A2 formed on the second sealing material 530. In this case, the thickness of the first region A1 may be thicker than the case of FIG. 6.

FIGS. 9 to 18 are diagrams illustrating a method for fabricating a semiconductor package according to an exemplary embodiment of the present inventive concept.

Figure 9:
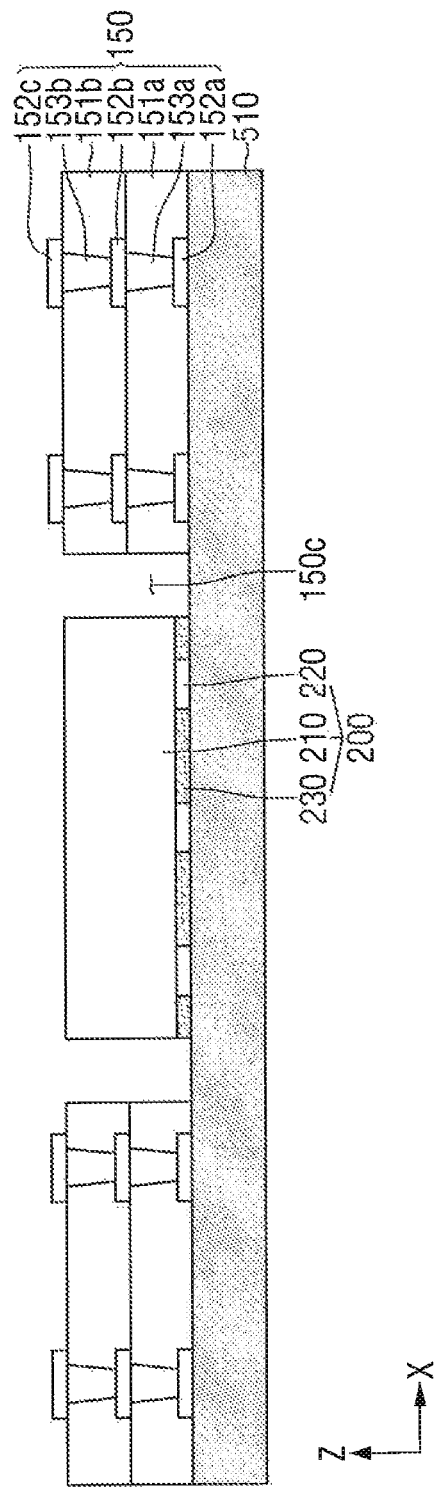
FIGS. 9, 10, 11, 12, 13, 14, 15, 16, 17, and 18 are diagrams illustrating a method for fabricating a semiconductor package according to an exemplary embodiment of the present inventive concept.

Referring to FIG. 9, the first semiconductor chip 200 is formed on a sacrificial member 510 so that a lower side of the first semiconductor chip 200 faces the sacrificial member 510. The connection pad 220 of the first semiconductor chip 200 may come into contact with the upper side of the sacrificial member 510.

A connecting structure 150 that includes first and second interlayer insulating layers 151a and 151b stacked on each other in the third direction Z and first and second connecting vias 153a and 153b formed in the first and second interlayer insulating layers 151a and 151b may be formed on the sacrificial member 510. The connecting structure 150 includes a first interlayer insulating layer 151a, a first connecting pad 152a, a second connecting pad 152b, a second interlayer insulating layer 151b, a third connecting pad 152c, a first connecting via 153a, a second connecting via 153b. The first interlayer insulating layer 151a is disposed on the sacrificial member 510. For example, the first interlayer insulating layer 151a is in contact with an upper side of the sacrificial member 510. The first connecting pad 152a is in contact with the upper side of the sacrificial member 510 and is covered by the first interlayer insulating layer 151a. The second connecting pad 152b is placed on the first interlayer insulating layer 151a. For example, the first connecting pad 152a is covered by a first surface (e.g., a lower surface) of the first interlayer insulating layer 151a, and the second connecting pad 152b is disposed on a second surface (e.g., an upper surface), opposite to the first surface, of the first interlayer insulating layer 151a. The second interlayer insulating layer 151b is disposed on the second surface of the first interlayer insulating layer 151a and covers at least a part of the second connecting pad 152b. The third connecting pad 152c is placed on the second interlayer insulating layer 151b. For example, the second connecting pad 152b is covered by a first surface (e.g., a lower surface) of the second interlayer insulating layer 151b, and the third connecting pad 152c is disposed on a second surface (e.g., an upper surface), opposite to the first surface, of the second interlayer insulating layer 151b. A first connecting via 153a penetrates the first interlayer insulating layer 151a and electrically connects the first and second connecting pads 152 and 152b to each other, and the second connecting via 153b penetrates the second interlayer insulating layer 151b and electrically connects the second and third connecting pads 152a and 152b to each other.

The sacrificial member 510 may include a tape or the like. For example, the sacrificial member 510 may include an ultraviolet curable adhesive tape whose adhesive force is weakened by ultraviolet rays, a heat treatment curable adhesive tape whose adhesive force is weakened by heat treatment, and the like. The sacrificial member 510 may extend in a plane in the first direction X and the second direction Y.

The connecting structure 150 may be formed on the sacrificial member 510 to be spaced apart from the first semiconductor chip 200 in the first direction X. For example, the connecting structure 150 has a cavity 150c in the form of a through hole between the connecting structure 150 and the first semiconductor chip 200.

Figure 10:
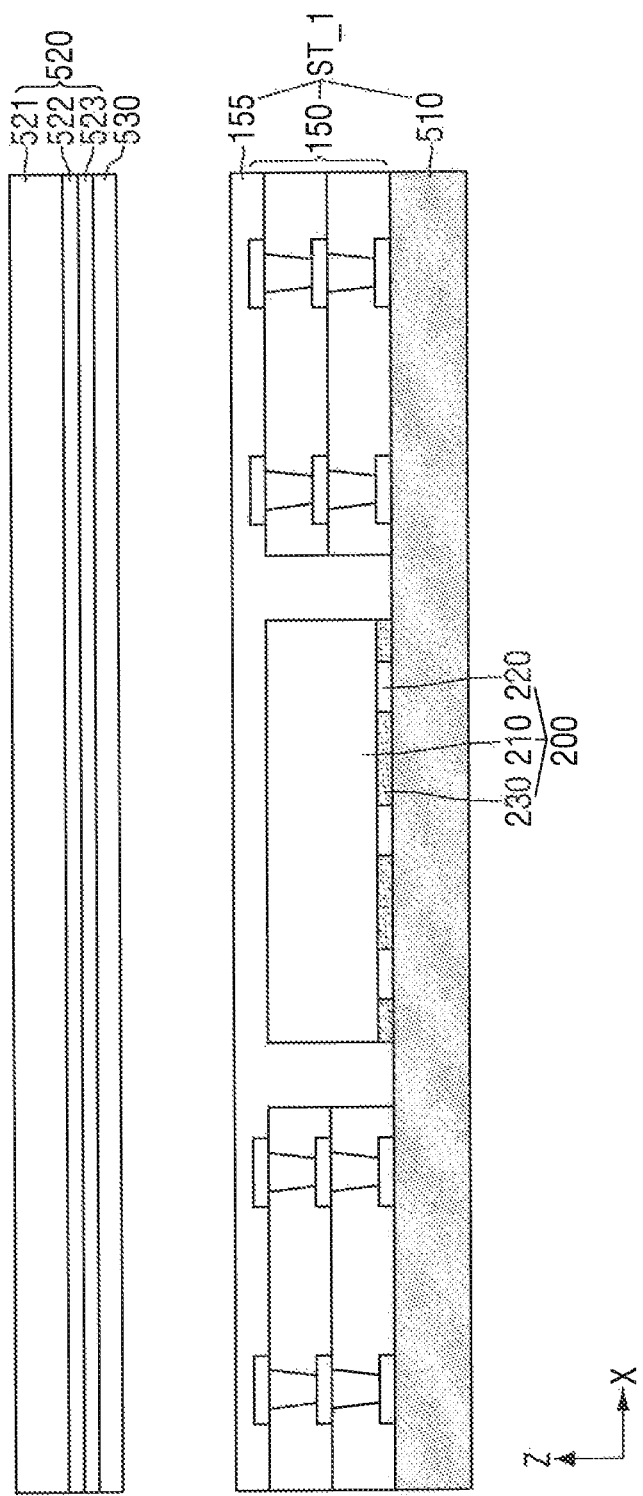

Referring to FIG. 10, a first sealing material 155 is formed to cover the third connecting pad 152c and the first semiconductor chip 200. The first sealing material 155 covers the upper side and the side face of the first semiconductor chip 200 to fill the cavity 150c. Accordingly, an intermediate structure ST_1 including the sacrificial member 510, the first semiconductor chip 200, and the first sealing material 155 is formed.

A first carrier 520, on which the second sealing material 530 is formed, may be bonded onto the intermediate structure ST_1 on which the first sealing material 155 is formed. The first carrier 520 includes a first metal layer 522 disposed on the support member 521, and a second metal layer 523 disposed on the first metal layer 522. For example, the support member 521 may include a CCL (Copper Clad Laminate), a PPG, an ABF (Ajimoto Build-up Film), epoxy, polyimide, and the like. The second sealing material 530 may be placed on the second metal layer 523. For example, the first sealing material 155 and the second sealing material 530, which are formed by separate processes, may be brought into direct contact with each other.

Figure 11:
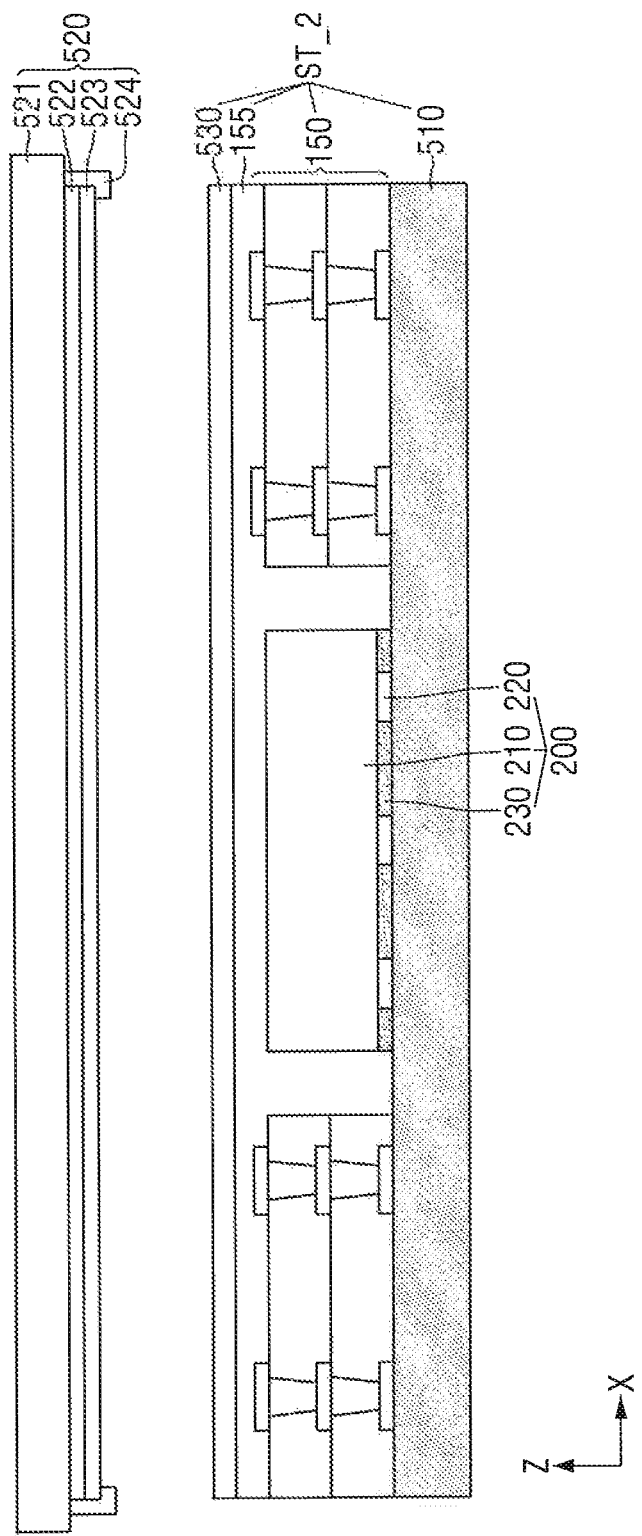

Referring to FIG. 11, unlike FIG. 10, an intermediate structure ST 2, which is formed by stacking the first sealing material 155 and the second sealing material 530 in advance, may be bonded with the first carrier 520. In this case, the first carrier 520 may further include an adhesive material 524 that sticks the first and second metal layers 522 and 523 to each other to be firmly attached to the support member 521. As the material of the adhesive material 524, an insulating substance may be included.

The second sealing material 530 may be formed on the first sealing material 155 by the process shown in FIG. 10 or 11. For example, the second sealing material 530 having a second filler content lower than the first filler content of the first sealing material 155 may be formed.

Figure 12:
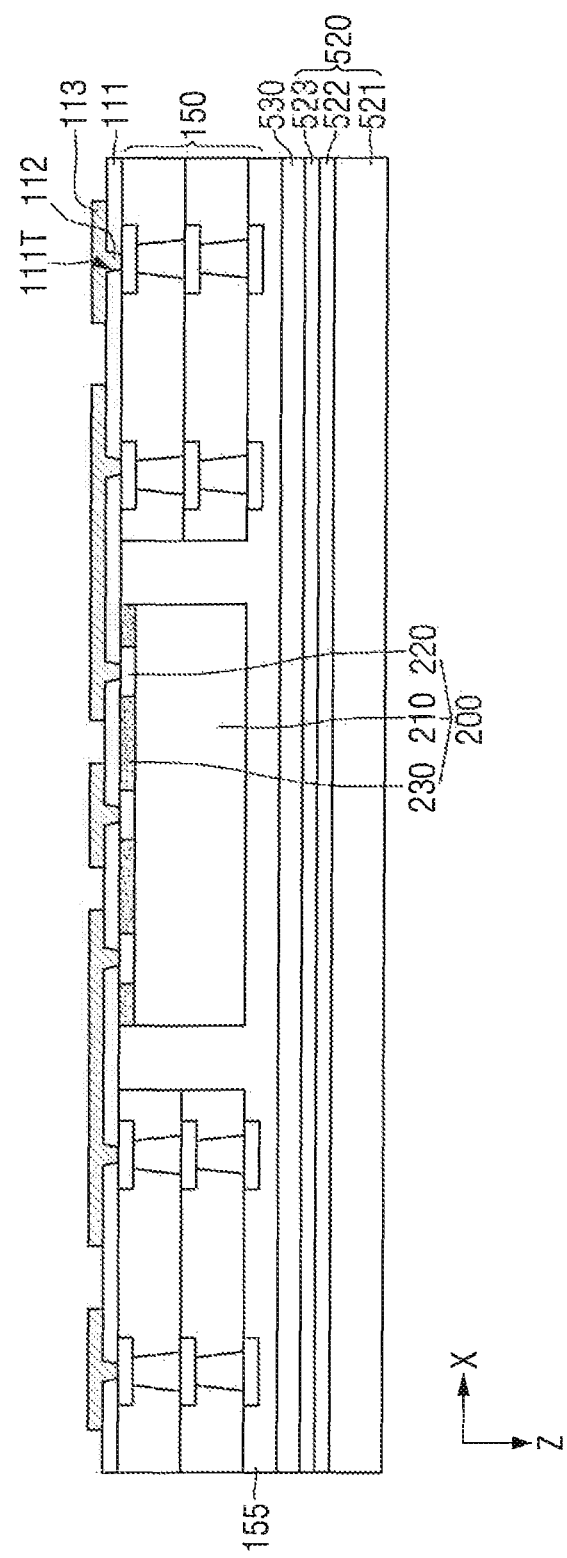

Referring to FIG. 12, the first redistribution layer 110 is formed on a lower side of the first semiconductor chip 200. For example, the first redistribution layer 110 may be formed on the lower side of the first semiconductor chip 200 on which the connection pad 220 is placed.

The insulating layer 111, the via 112 and the line wiring 113 may be formed on the lower side of the first semiconductor chip 200 to redistribute the connection pad 220. Further, the insulating layer 111, the via 112 and the line wiring 113 may be formed on the first connecting pad 152a of the connecting structure 150.

The insulating layer 111 may be an insulating substance such as a photosensitive insulating resin (PID). A trench 111T, which exposes the connection pad 220 and the first connecting pad 152a, is formed after the insulating layer 111 is formed. The via 112 may be formed by filling the trench 111T, and the line wiring 113 may be formed on the via 112 and the insulating layer 111.

Further, the sacrificial member 510 on the lower side of the first semiconductor chip 200 may be peeled off. For example, the sacrificial member 510 may be peeled off from the first semiconductor chip 200 and connecting structure 150.

For example, when the sacrificial member 510 is a heat-treated curable adhesive tape, the sacrificial member 510 may be peeled off after being heat-treated to weaken the adhesive force. For example, when the sacrificial member 510 is an ultraviolet curable adhesive tape, the sacrificial member 510 may be peeled off after being irradiated with ultraviolet rays to weaken the adhesive force.

Figure 13:
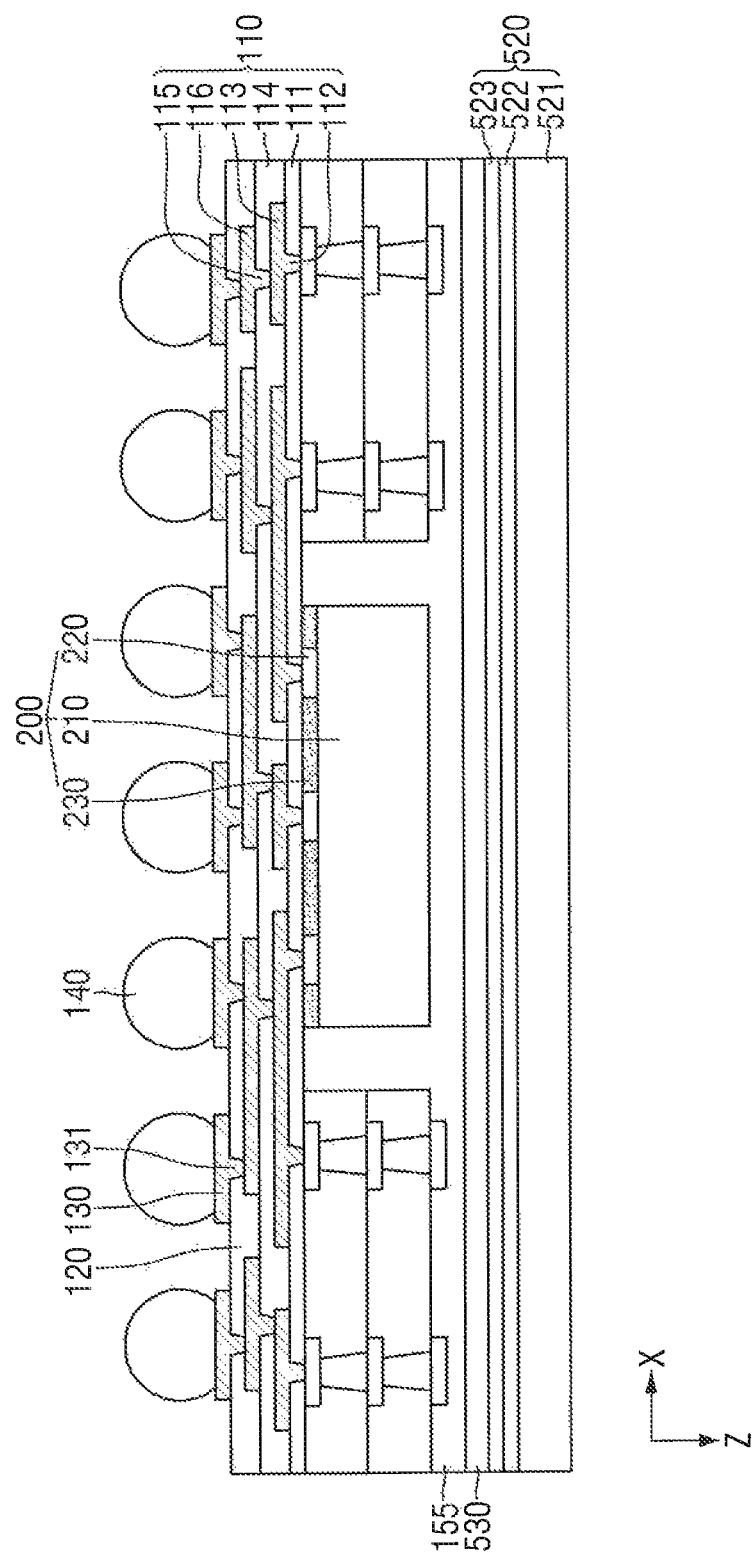

Referring to FIG. 13, the insulating layer 114, the via 115 and the line wiring 116 may be formed on the insulating layer 111, the via 112 and the line wiring 113. The insulating layer 114, the via 115 and the line wiring 116 may be formed in the same manner as the insulating layer 111, the via 112 and the line wiring 113. Accordingly, the first redistribution layer 110 including the insulating layer 111, the via 112, the line wiring 113, the insulating layer 114, the via 115 and the line wiring 116 may redistribute the connection pad 220 and the connecting structure 150.

The passivation layer 120 may be formed on the first redistribution layer 110. The passivation layer 120 may protect the first redistribution layer 110.

An opening 131 is formed in the passivation layer 120, and the line wiring 116 may be exposed by the opening 131. An underbump metal layer 130 may be formed on the exposed line wiring 116 and the passivation layer 120.

At this time, a region in which the first redistribution layer 110, the passivation layer 120, and the underbump metal layer 130 are formed may be wider than a region on which the connection pad 220 of the first semiconductor chip 200 is placed. For example, the connection pad 220 of the first semiconductor chip 200 may be redistributed into a wider region through the first redistribution layer 110.

The connection terminal 140 may be connected on the underbump metal layer 130. At this time, at least one of the plurality of connection terminals 140 may be placed in the fan-out region. Therefore, the semiconductor package 100 may be a fan-out semiconductor package.

Figure 14:
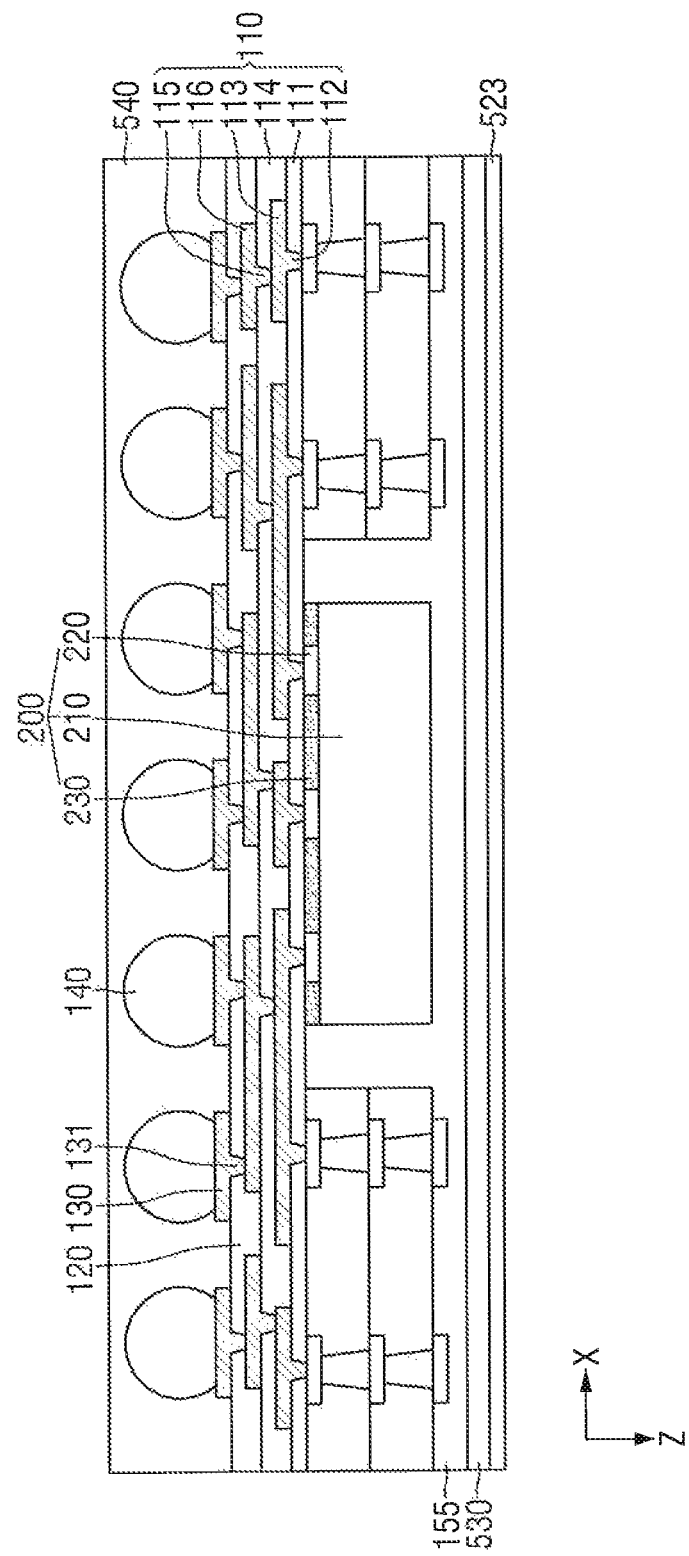

Referring to FIG. 14, a second carrier 540 may be formed on the first redistribution layer 110 on which the connection terminals 140 are formed.

The second carrier 540 may be formed on the first redistribution layer 110 to cover the underbump metal layer 130 and the connection terminal 140.

Further, the support member 521 and the first metal layer 522 of the first carrier 520 may be removed.

Figure 15:
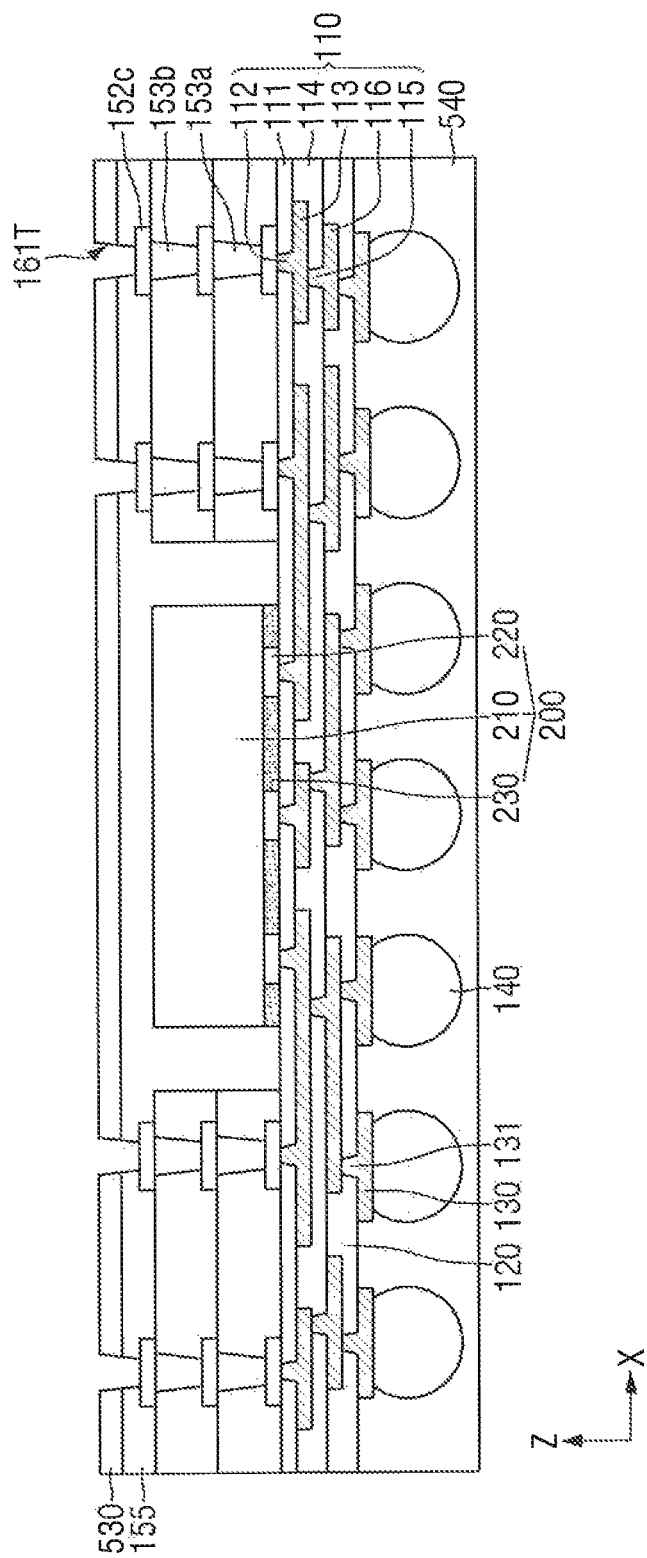

Referring to FIG. 15, the second metal layer 523 of the first carrier 520 may be removed to expose the second sealing material 530. A first via hole 161T is formed in a region of the second sealing material 530 corresponding to the first and second connecting vias 153a and 153b to expose the third connecting pad 152c. For example, the first via hole 161T may overlap the first and second connecting vias 153a and 153b.

Although the shape of the first via hole 161T may be a tapered shape in which the width becomes narrower toward the lower part, present inventive concept is not limited thereto, and the first via hole 161T may have a shape having a constant width.

The method of forming the first via hole 161T that partially penetrates the first sealing material 155 may be a formation of a mask on the second sealing material 530 except for the region in which the first via hole 161T is machined.

Figure 16:
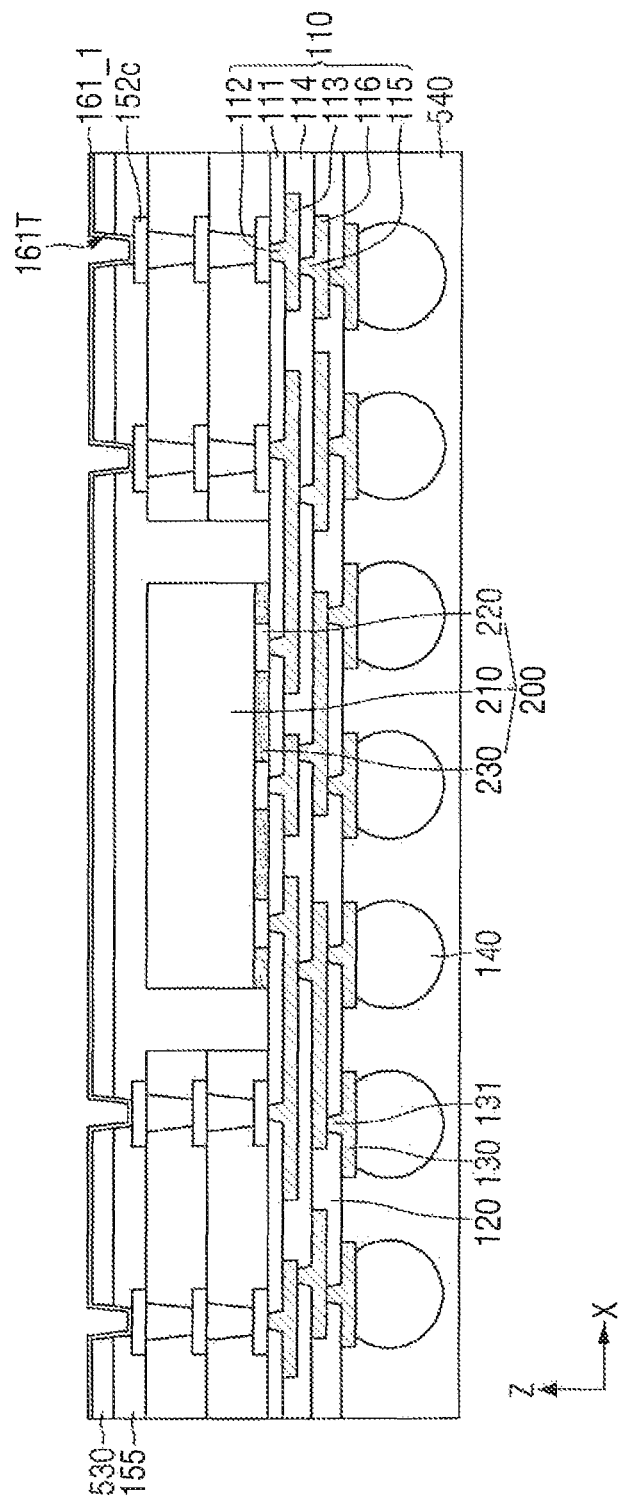

Referring to FIG. 16, the seed layer 161_1 is formed in the first via hole 161T. The seed layer 161_1 may be conformally formed along the side walls and bottom side of the first via hole 161T and the upper surface of the second sealing material 530. The seed layer 161_1 may come into contact with the third connecting pad 152c.

The seed layer 161_1 may include a metallic substance. For example, the seed layer 161_1 may include, but is not limited to, copper (Cu). The seed layer 161_1 may be formed by a sputtering method. In this case, the thinner seed layer 161_1 may be formed as compared with the conventional case in which the seed layer 161_1 is formed by electroless plating.

Figure 17:
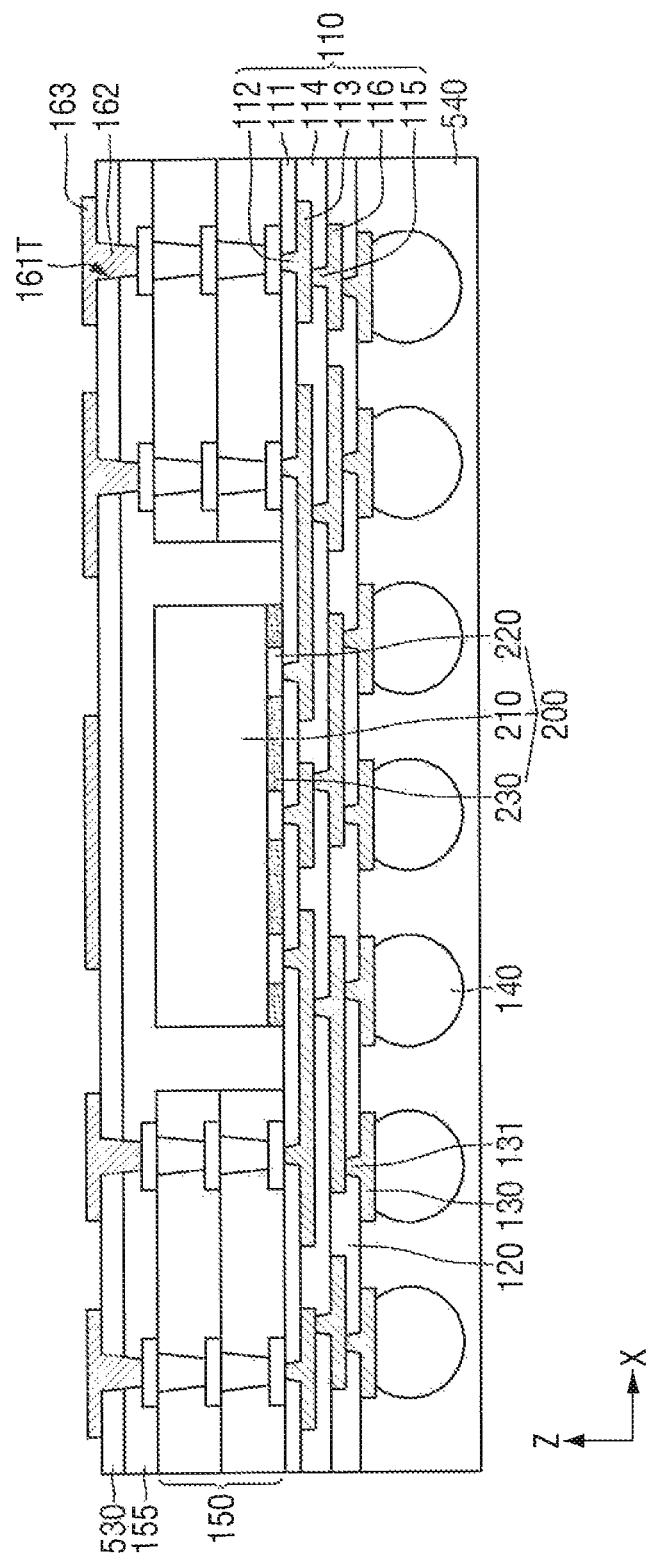

Referring to FIG. 17, the first via 162 is formed to fill the first via hole 161T. For example, a partial region of the seed layer 161_1 formed along the upper surface of the second sealing material 530 is removed, and the conductor layer 1612 is formed on the seed layer 161_1 to fill the first via hole 161T and form the first via 162.

A part of the first via 162 may be formed inside the second sealing material 530, and the other part of the first via 162 may be formed inside the first sealing material 155.

Line wirings 163 spaced apart from each other in the first direction X are formed on the first via 162 and the second sealing material 530. The first via 162 may physically and electrically connect the connecting structure 150 and the line wiring 163 to each other.

Figure 18:
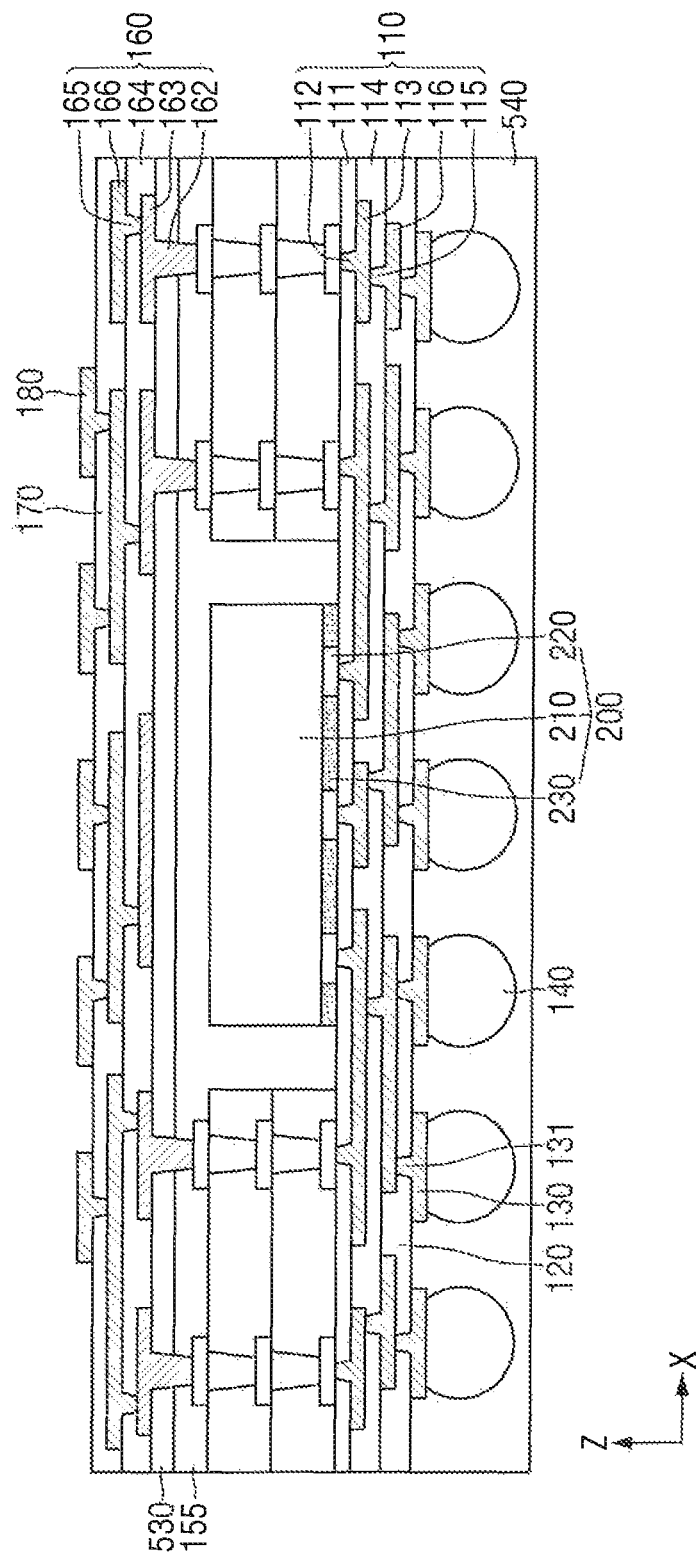

Referring to FIG. 18, the insulating layer 164, the via 165 and the line wiring 166 may be formed on the second sealing material 530, the first via 162 and the line wiring 163. Accordingly, the second redistribution layer 160 including the first via 162, the line wiring 163, the insulating layer 164, the via 165 and the line wiring 166 may redistribute the connection pad 220 and the connecting structure 150.

A passivation layer 170 may be formed on the second redistribution layer 160. The passivation layer 170 may protect the second redistribution layer 160.

An opening is formed in the passivation layer 170, and the line wiring 166 may be exposed. An underbump metal layer 180 may be formed on the exposed line wiring 166 and the passivation layer 170.

After that, referring to FIG. 5, the connection terminal 190 may be formed on the underbump metal layer 180.

In addition, the second carrier 540 may be peeled off. For example, the second carrier 540 may be peeled off from the stuck passivation layer 120 and underbump metal layer 130.

Further, the semiconductor package 400 may be mounted on the connection terminal 190. For example, the connection pad 410 of the semiconductor package 400 may be connected to the connection terminal 190. The semiconductor package 400 may include a second semiconductor chip different from the first semiconductor chip 200, and the first semiconductor chip 200 and the second semiconductor chip may be electrically connected to each other through the first redistribution layer 110, the connecting structure 150 and the second redistribution layer 160.

Figure 19:
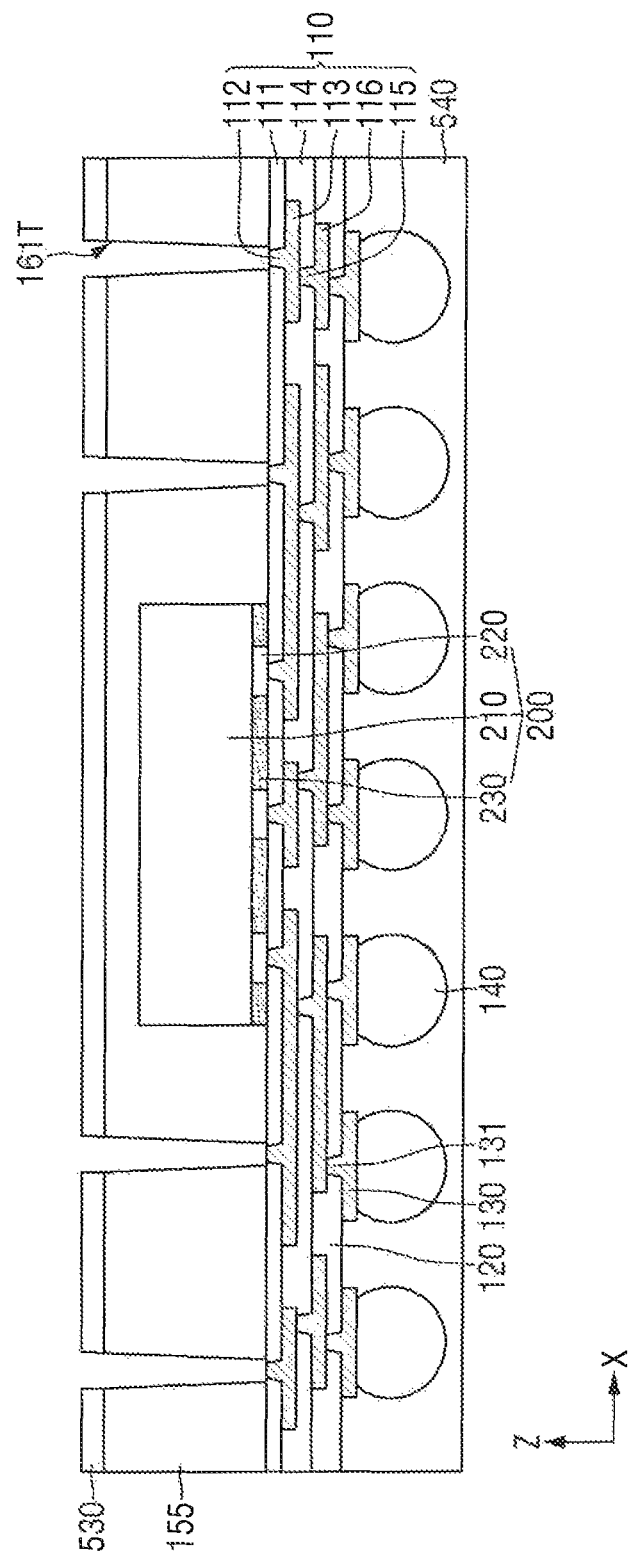
FIGS. 19, 20 and 21 are diagrams illustrating a method for fabricating a semiconductor package according to an exemplary embodiment of the present inventive concept.
Figure 20:
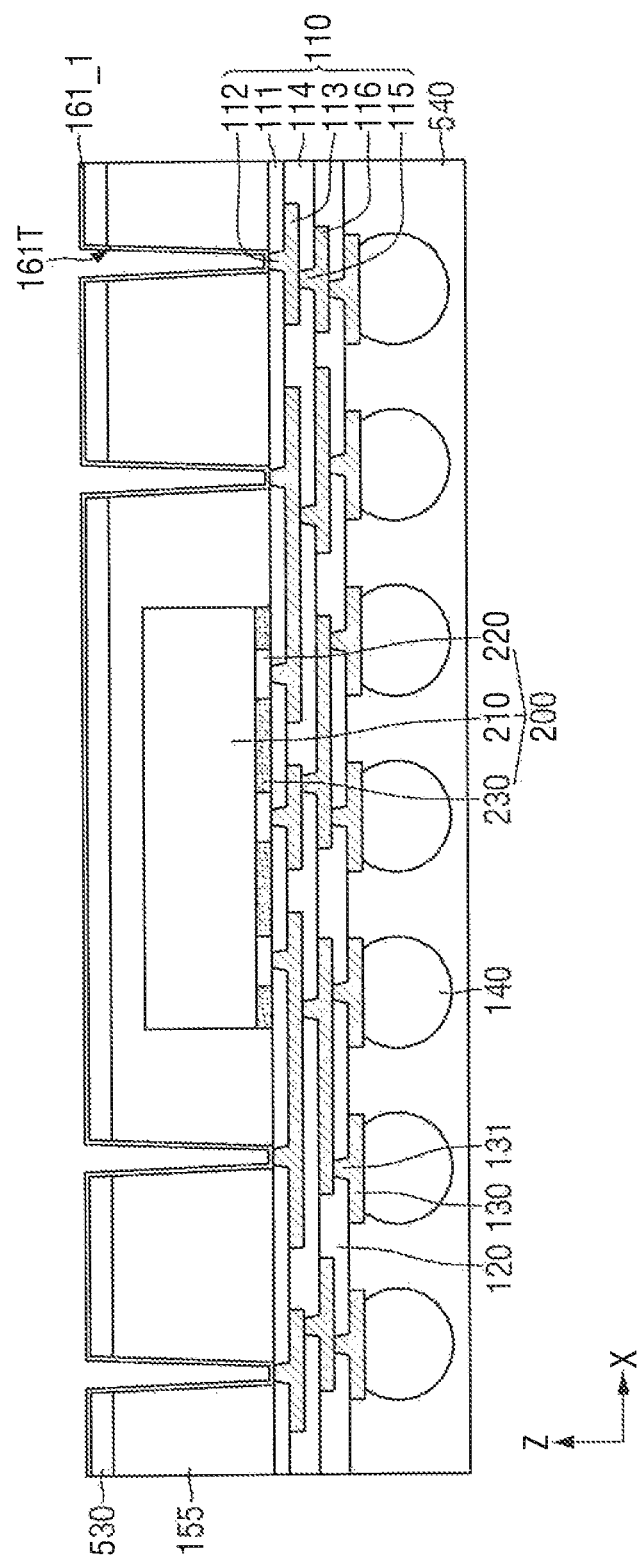
Figure 21:
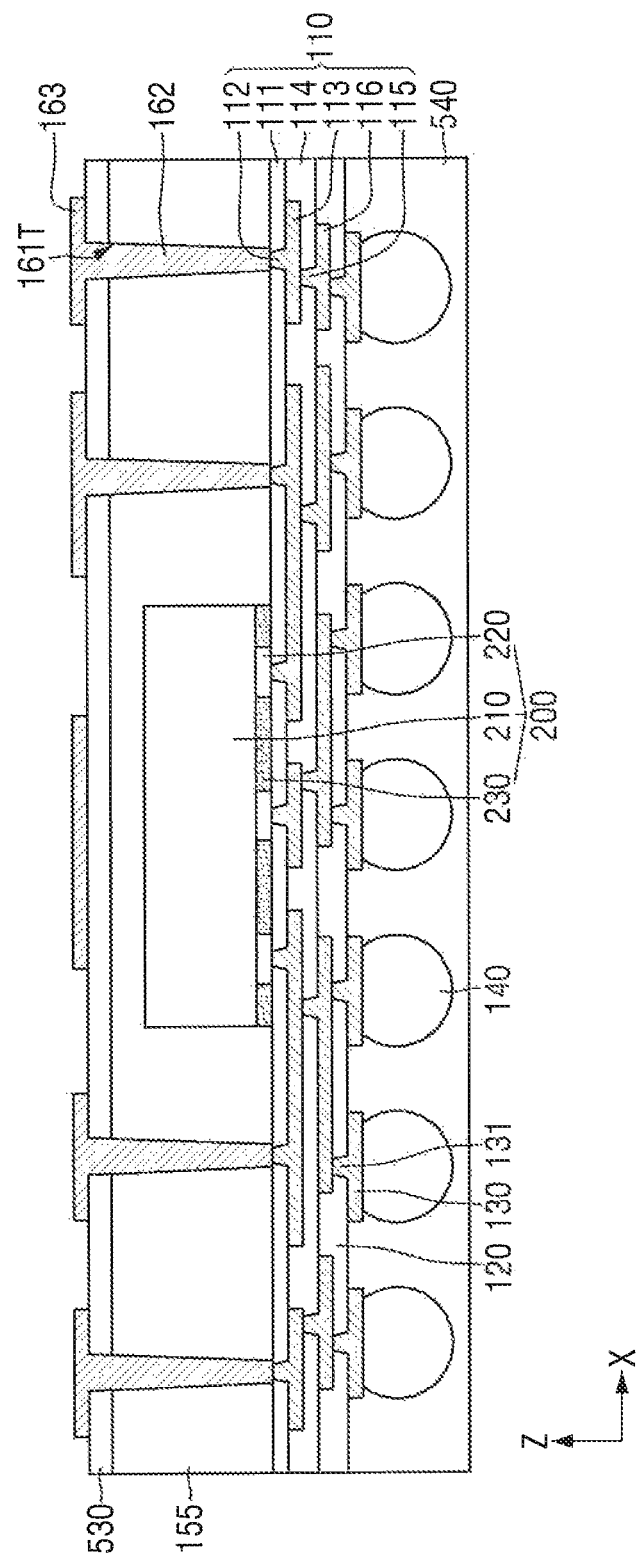

FIGS. 19 to 21 are diagrams illustrating a method for fabricating a semiconductor package according to an exemplary embodiment of the present inventive concept. To the extent that various elements are not described in detail with respect to FIGS. 19 to 21, it may be assumed that these elements are at least similar to corresponding elements described in detail elsewhere within the instant application. Corresponding elements may have similar or identical reference numerals or may otherwise be recognizable as corresponding based on context.

Referring to FIGS. 7 and 19, a semiconductor package 100a may include a first via 162 that penetrates the first sealing material 155. Similarly to FIG. 15, the second metal layer 523 of the first carrier 520 may be removed to expose the second sealing material 530. A first via hole 161T is formed in a region of the second sealing material 530 to expose the via 112.

The first via hole 161T may penetrate the second sealing material 530 and extend to the upper side of the insulating layer 111 through the first sealing material 155. The side wall of the first via hole 161T may be defined by the first sealing material 155 and the second sealing material 530. The first via hole 161T may penetrate the first sealing material 155.

Although the shape of the first via hole 161T may be a shape having a tapered shape in which the width becomes narrower toward the lower part, the present inventive is not limited thereto, and for example, the first via hole 161T may have a shape with a constant width.

For example, by forming a thick mask on the second sealing material 530 except for the region in which the first via hole 161T is machined, the first via hole 161T may be machined to be deeper than that in FIG. 15.

Referring to FIG. 20, a seed layer 161_1 is formed in the first via hole 161T and on the second sealing material 530. For example, the seed layer 161_1 may be conformally formed along the side walls and bottom side of the first via hole 161T and the upper surface of the second sealing material 530. The seed layer 161_1 may come into contact with the via 112.

Referring to FIG. 21, the first via 162 is formed to fill the first via hole 161T. For example, a portion of the seed layer 161_1 formed along the upper surface of the second sealing material 530 is removed, and the conductor layer 161_2 is formed on the seed layer 161_1 to fill the first via hole 161T.

Line wirings 163 spaced apart from each other in the first direction X are formed on the first via 162 and the second sealing material 530. The first via 162 may physically and electrically connect the via 112 to the line wiring 163.

While the present inventive concept has been described with reference to exemplary embodiments thereof, it will be understood by those of ordinary skill in the art that various changes in form and details may be made thereto without departing from the spirit and scope of the present invention.

What is claimed is:

1. A semiconductor package comprising:
a first redistribution layer;
a first semiconductor chip including a first side and a second side, wherein the first side faces the first redistribution layer;
a first sealing material covering the second side of the first semiconductor chip and having a first filler content;
a second sealing material formed on the first sealing material and having a second filler content lower than the first filler content; and
a second redistribution layer disposed on the second sealing material,
wherein a first via hole penetrates the first sealing material and the second sealing material, wherein the first via hole has an uneven surface,
wherein the second redistribution layer includes the first via hole and a first via, and wherein the first via fills the first via hole, wherein the first via hole includes a first region and a second region, wherein the first region is formed on the first sealing material, and the second region is formed on the second sealing material, and wherein a first surface roughness of the second region is smaller than a second surface roughness of the first region.

2. The semiconductor package of claim 1, wherein the second sealing material does not include a filler.

3. The semiconductor package of claim 2, wherein at least some of the filler is located at a boundary between the first sealing material and the second sealing material, and no filler is located inside the second sealing material.

4. The semiconductor package of claim 1, wherein, in the second sealing material, a filler content at a first position is lower than the filler content at a second position, wherein the first position is separated from the second redistribution layer by a first distance, and the second position is separated from the second redistribution layer by a second distance farther from the second redistribution layer than the first distance.

5. The semiconductor package of claim 1, wherein the first via includes:

a seed layer formed in the first via hole; and a conductor layer formed on the seed layer to fill the first via hole, wherein the seed layer is a sputtering layer.

6. The semiconductor package of claim 1, further comprising:

a connecting structure disposed on the first redistribution layer and spaced apart from the first semiconductor chip, wherein the connecting structure includes an interlayer insulating layer and a first connecting via formed inside the interlayer insulating layer, and wherein the first connecting via and the first via of the second redistribution layer are electrically connected to each other.

7. The semiconductor package of claim 6, wherein the first sealing material fills a space between the first semiconductor chip and the connecting structure.

8. The semiconductor package of claim 1, wherein a connecting pad is formed on the first side of the first semiconductor chip, and the connecting pad is electrically connected to the first redistribution layer.

9. A semiconductor package comprising:

a first redistribution layer;

a first semiconductor chip having a first side and a second side, wherein the first side is on the first redistribution layer, and the second side faces the first side;

a first sealing material contacting the second side of the first semiconductor chip and having a first filler content;

a second sealing material formed on the first sealing material and having a second filler content lower than the first filler content; and a second redistribution layer placed on the second sealing material, wherein the second redistribution layer includes a first via hole and a first via, wherein the first via hole penetrates the first and second sealing materials, and the first via fills the first via hole, wherein the first via hole includes a first region and a second region, wherein the first region is formed on the first sealing material, and the second region is formed on the second sealing material, and wherein a first surface roughness of the second region is smaller than a second surface roughness of the first region.

10. The semiconductor package of claim 9, wherein the second sealing material does not include a filler.

11. The semiconductor package of claim 9, wherein a filler is located at a boundary between the first sealing material and the second sealing material, and no filler is located inside the second sealing material.

12. The semiconductor package of claim 9, wherein the first via includes a seed layer and a conductor layer, wherein the seed layer is conformally formed along a side wall and a bottom side of the first via hole, wherein the conductor layer is formed on the seed layer and fills the first via hole, and wherein the seed layer is a sputtering layer.

13. The semiconductor package of claim 9, further comprising:

a connecting structure placed on the first redistribution layer and spaced apart from the first semiconductor chip, wherein the connecting structure includes an interlayer insulating layer and a first connecting via formed inside the interlayer insulating layer, and wherein the first connecting via and the first via of the second redistribution layer are electrically connected to each other.

14. A method for fabricating a semiconductor package, the method comprising:

forming a first semiconductor chip including a first side and a second side, wherein the first side faces a sacrificial member;

forming a first sealing material having a first filler content and covering the second side of the first semiconductor chip;

forming a second sealing material on the first sealing material and having a second filler content lower than the first filler content; and forming a second redistribution layer on the second sealing material, wherein the formation of the second redistribution layer includes:

forming a first via hole penetrating the first sealing material and the second sealing material, wherein the first via hole has an uneven surface, wherein the second redistribution layer includes the first via hole and a first via, and wherein the first via fills the first via hole, wherein the first via hole includes a first region and a second region, wherein the first region is formed on the first sealing material, and the second region is formed on the second sealing material, and wherein a first surface roughness of the second region is smaller than a second surface roughness of the first region.

15. The method for fabricating the semiconductor package of claim 14, wherein the formation of the second redistribution layer includes:

forming a seed layer conformally along a side wall and a bottom side of the first via hole; and forming a conductor layer on the seed layer, wherein the conductor layer fills the first via hole.

16. The method for fabricating the semiconductor package of claim 15, wherein the formation of the seed layer uses a sputtering type.

17. The method for fabricating the semiconductor package of claim 14, wherein the formation of the second sealing material includes
bonding an intermediate structure and a carrier, wherein the intermediate structure includes the first sealing material, and the carrier includes the second sealing material, and wherein the first sealing material and the second sealing material come into direct contact with each other from the bonding between the intermediate structure and the carrier.

18. The method for fabricating the semiconductor package of claim 17, further comprising:
between formation of the first sealing material and formation of the second redistribution layer, removing a support member, a first metal layer, and a second metal layer from the second sealing material, wherein the carrier includes the support member, the first metal layer disposed on the support member, and the second metal layer disposed on the first metal layer;
after bonding the intermediate structure and the carrier, removing the sacrificial member; and
forming a first redistribution layer on the first side of the semiconductor chip.

* * * * *